US 7,171,609 B2

(12) United States Patent
Wilson et al.

(10) Patent No.: US 7,171,609 B2
(45) Date of Patent: Jan. 30, 2007

(54) PROCESSOR AND METHOD FOR CONVOLUTIONAL DECODING

(75) Inventors: Danny W. Wilson, Garland, TX (US); Shannon A. Wichman, McKinney, TX (US)

(73) Assignee: VeriSilicon Holdings Company Ltd., Plano, TX (US)

( * ) Notice: Subject to any disclaimer, the term of this patent is extended or adjusted under 35 U.S.C. 154(b) by 417 days.

(21) Appl. No.: 10/613,128

(22) Filed: Jul. 3, 2003

(65) Prior Publication Data
US 2004/0153953 A1 Aug. 5, 2004

Related U.S. Application Data

(60) Provisional application No. 60/444,702, filed on Feb. 3, 2003.

(51) Int. Cl.
*H03M 13/03* (2006.01)
(52) U.S. Cl. ...................... 714/795; 714/796
(58) Field of Classification Search ............... 714/795, 714/796
See application file for complete search history.

(56) References Cited

U.S. PATENT DOCUMENTS

| | | | | |
|---|---|---|---|---|
| 4,788,694 A | * | 11/1988 | Calderbank | 375/295 |
| 5,418,795 A | * | 5/1995 | Itakura et al. | 714/746 |
| 5,521,767 A | * | 5/1996 | Weng et al. | 360/46 |
| 5,586,128 A | * | 12/1996 | Chen | 714/792 |
| 5,878,092 A | * | 3/1999 | Choi | 375/341 |
| 5,907,586 A | * | 5/1999 | Katsuragawa et al. | 375/341 |
| 6,201,839 B1 | * | 3/2001 | Kavcic et al. | 375/341 |
| 6,282,251 B1 | * | 8/2001 | Worstell | 375/341 |
| 6,411,224 B1 | * | 6/2002 | Wilson et al. | 341/59 |
| 6,438,180 B1 | * | 8/2002 | Kavcic et al. | 375/341 |
| 6,889,154 B2 | * | 5/2005 | Ashley et al. | 702/107 |

* cited by examiner

*Primary Examiner*—Guy Lamarre
*Assistant Examiner*—Mujtaba K. Chaudry

(57) ABSTRACT

A disclosed processor includes update logic coupled to a register. The update logic receives a first signal indicative of a first add-compare-select (ACS) instruction result and a second signal indicative of a second ACS instruction result, and updates the contents of the register dependent upon the first and second signals. In the event the first and second signals are received substantially simultaneously, the update logic shifts the contents of the register 2 bit positions in order thereby vacating 2 consecutive bit positions, updates one of the vacated bit positions dependent upon the first signal, and updates the other vacated bit position dependent upon the second signal. A described method for decoding convolutional code includes generating computer program code for a processor including two or more ACS instructions. Storage elements specified by each of the ACS instructions are selected such that the processor can execute the ACS instructions substantially simultaneously.

16 Claims, 11 Drawing Sheets

← 308

| OPCODE FIELD 600 | DESTINATION REGISTER FIELD 602 | SOURCE REG. 1 FIELD 604 | SOURCE REG. 2 FIELD 606 |
|---|---|---|---|

FIG. 6A

REGISTER:

| R0 | XXXX | |
|---|---|---|
| {R5, R4} | 0X1123 | 0X0030 |
| {R7, R6} | 0X000A | 0X0008 |
| VITR | 0X00000000 | |

FIG. 6B

REGISTER:

| R0 | 0X0038 | |
|---|---|---|
| {R5, R4} | 0X1123 | 0X0030 |
| {R7, R6} | 0X000A | 0X0008 |
| VITR | 0X00000001 | |

FIG. 6C

| OPCODE FIELD 700 | DESTINATION REGISTER FIELD 702 | SOURCE REG. 1 FIELD 704 | SOURCE REG. 2 FIELD 706 |

REGISTER:

| R1 | XXXX | |
|---|---|---|
| {R5, R4} | 0X8000 | 0XFF30 |
| {R7, R6} | 0X000A | 0XFF00 |
| VITR | 0X00000001 | |

REGISTER:

| R1 | 0X7F00 | |
|---|---|---|
| {R5, R4} | 0X8000 | 0XFF30 |
| {R7, R6} | 0X000A | 0XFF00 |
| VITR | 0X00000002 | |

1100

```
┌─────────────────────────────────────────────┐
│   GENERATE COMPUTER PROGRAM CODE            │
│          FOR A PROCESSOR                    │
│          INCLUDING TWO OR MORE              │
│   ADD-COMPARE-SELECT (ACS) INSTRUCTIONS,    │
│        WHEREIN STORAGE ELEMENTS             │
│      SPECIFIED BY THE ACS INSTRUCTIONS      │
│    ARE SELECTED SUCH THAT THE PROCESSOR     │
│       WILL SIMULTANEOUSLY EXECUTE THE       │
│             ACS INSTRUCTIONS,               │
│      AND THE COMPUTER PROGRAM CODE,         │
│       WHEN EXECUTED BY THE PROCESSOR,       │
│         CAUSES THE PROCESSOR TO:            │
│             (I) RECEIVE SYMBOLS             │
│          OF THE CONVOLUTIONAL CODE          │
│                IN SEQUENCE,                 │
│    (II) USE THE RECEIVED SYMBOLS TO BUILD   │
│     A DATA STRUCTURE COMPRISING DATA        │
│    INDICATIVE OF MOST LIKELY TRANSITIONS    │
│      BETWEEN NODES OF A TRELLIS DIAGRAM     │
│      AND ASSOCIATED INPUT VALUES, AND       │
│          (III) USE THE DATA STRUCTURE       │
│         TO PRODUCE THE INPUT VALUES         │
│  CORRESPONDING TO THE RECEIVED SYMBOLS      │
│           OF THE CONVOLUTIONAL CODE         │
│                                        1102 │
└─────────────────────────────────────────────┘
                      │
                      ▼
┌─────────────────────────────────────────────┐
│          INITIATE EXECUTION                 │
│     OF THE COMPUTER PROGRAM CODE            │
│              BY THE PROCESSOR               │
│                                        1104 │
└─────────────────────────────────────────────┘
```

FIG. 11

PROCESSOR AND METHOD FOR CONVOLUTIONAL DECODING

CROSS-REFERENCE TO RELATED APPLICATIONS

This application for a utility patent claims the benefit of U.S. Provisional Application No. 60/444,702 filed Feb. 3, 2003.

FIELD OF THE INVENTION

This invention relates generally to data processing systems and digital coding and decoding methods and, more particularly, to data processing systems and methods for decoding convolutional code.

BACKGROUND OF THE INVENTION

Many modern data transmission systems use channel coding to reduce bit error rates (BERs) of noisy communication channels. In channel coding a transmitter transmits both data and redundant information generated using the data to a receiver via a channel. The receiver uses the redundant information to correct errors in the data.

Convolutional coding and block coding are the two major forms of channel coding used today. Designed to work on a few bits of data at a time, convolutional coding is particularly well suited for processing continuous data streams. In addition to its use in channel coding, convolutional coding also finds use in optical storage devices, image processing, speech recognition, multiple target tracking, holographic memory systems, predicting microwave propagation loss, and handwriting recognition, for example.

FIG. 1 is a diagram of one embodiment of a convolutional encoder 100 including 4 storage registers 102A–102D connected in series to form a shift register 104, and two EXCLUSIVE-OR gates 106A and 106B. As indicated in FIG. 1, each of the 4 storage registers 102A–102D represents a different one of 4 state elements $S_0$–$S_3$. The 4 state elements $S_0$–$S_3$ define $2^4$=16 unique states of the convolutional encoder 100 defined by the state element grouping "$S_3S_2S_1S_0$." Taps between various stages of the shift register 104 provide inputs to the EXCLUSIVE-OR gates 106A and 106B. At time interval n (i.e., in stage n), the first register 102A of the shift register 104 receives input data bit D(n). The previous value stored in the first register 102A, D(n−1), is shifted into the second register 102B. Similarly, the value stored in the second register 102B, D(n−2), is shifted into the third register 102C. The value in the third register 102C, D(n−3) shifts into the fourth register 102D and the value in the fourth register 102D, D(n−4) is shifted out of the shift register 104. The EXCLUSIVE-OR gate 106A produces a first output bit $G_0$ where $G_0$=D(n)+D(n−3)+D(n−4), and the EXCLUSIVE-OR gate 106B produces a second output bit $G_1$ where $G_1$=D(n)+D(n−1)+D(n−3)+D(n−4).

As each input data bit can influence output bits over 5 sequential time intervals (stages), the convolutional encoder 100 of FIG. 1 is said to have a constraint length K=5. Two output bits are produced for every input data bit, thus the convolutional encoder 100 of FIG. 1 has a code rate of ½.

Viterbi decoding is a popular technique for decoding convolution codes. The Viterbi decoding algorithm has fixed decoding times and is well suited for hardware implementations. Viterbi decoding, also known as maximum-likelihood decoding, generally involves finding an optimal path through a trellis diagram, then tracing back through the trellis diagram along the optimal path to generate decoded output bits. In general, a trellis diagram includes information regarding each of the states at chronological time intervals (i.e., stages). A common two-dimensional representation of a trellis diagram is an array of nodes having a row for each state and a column for each stage. Arrows or lines between nodes in sequential stages represent transitions or branches between the states.

FIG. 2 is a diagram of a portion 200 of a trellis diagram corresponding to the convolutional encoder 100 of FIG. 1. The trellis diagram may be used to represent the convolutional encoding performed by the encoder 100 and/or the decoding of the convolutional code produced by the encoder 100. The portion 200 of the trellis diagram shown in FIG. 2 includes an array of nodes arranged in 16 rows, one for each of the 16 possible states of the encoder 100, and 2 columns, one for a stage (n−1) and a second for a subsequent stage n. Arrows between the nodes represent transitions or branches between the states. Arrows with solid lines represent transitions occurring when the input data bit D(n) to the encoder 100 of FIG. 1 is a '0', and arrows with dashed lines represent transitions occurring when the input data bit D(n) encoder 100 is a '1'.

In FIG. 2, two pairs of encoded input bits ($G_0$, $G_1$), generated using the equations above, are shown above each node in stage (n−1). The first pair of encoded input bits is the output bits produced by the encoder 100 when the input data bit D(n) is a '0', and the second pair of encoded input bits is the output bits produced by the encoder 100 when the input data bit D(n) encoder 100 is a '1'.

During Viterbi decoding, a cost metric is used at each stage of the trellis diagram to compute branch costs for each transition or branch. At each state, a branch cost associated with each of two incoming paths are computed and used to select a "survivor" path; the non-surviving path is abandoned. The branch cost associated with a particular transition represents the probability of the transition being correct. For a trellis diagram having a total of M states, at most M paths survive at each stage regardless of the number of stages. The M path costs associated with the M surviving paths are maintained as path metrics, each being a stage-by-stage, cumulative sum of the individual branch costs along the corresponding path. Each path metric represents a probability that the sequence of transitions along the path is correct.

At each stage, path metrics for each new state are calculated using each incoming branch cost plus the previous path cost associated with that branch. The minimum of the two incoming paths is selected as the survivor.

After completing a number of stages greater than the message frame length, a path having the greatest probability of being correct (i.e., having the most favorable metric) is identified by tracing back from node to node through the history of the surviving paths in reverse order. At each stage the surviving path having the greatest probability of being correct (i.e., having the lowest path metric) is selected. For each selected transition, a state transition table for the convolutional encoder 100 of FIG. 1 is used to determine the input data values resulting in the selected transition. The original input data bit sequence can thus be obtained in reverse order.

SUMMARY OF THE INVENTION

A processor and method are disclosed for decoding convolutional code. An embodiment of the processor may include update logic coupled to a register. The register may include multiple ordered bit positions. The update logic can receive a first signal indicative of a result of a first add-compare-select (ACS) instruction and a second signal indicative of a result of a second ACS instruction. The update logic can update the contents of the register dependent upon the first and second signals. In the event the first and second signals are received substantially simultaneously, the update logic can shift the contents of the register 2 bit positions in order thereby vacating 2 consecutive bit positions, update one of the vacated bit positions dependent upon the first signal, and update the other vacated bit position dependent upon the second signal.

An embodiment of a method for decoding convolutional code may include generating computer program code for a processor, wherein the computer program code includes two or more add-compare-select (ACS) instructions. Storage elements specified by each of the ACS instructions are selected such that the processor will simultaneously execute the ACS instructions. The computer program code, when executed by the processor, causes the processor to: (i) receive symbols of the convolutional code in sequence, wherein each symbol has a corresponding input value used to generate the symbol, (ii) use the received symbols to build a data structure comprising data indicative of most likely transitions between nodes of a trellis diagram and input values associated with the most likely transitions, and (iii) use the data structure to produce the input values corresponding to the received symbols of the convolutional code. Execution of the computer program code by the processor is initiated.

A computer readable medium is disclosed that embodies program instructions for performing a method for decoding convolutional code. The method includes receiving symbols of the convolutional code in sequence, wherein each symbol has a corresponding input value used to generate the symbol. The received symbols are used to build a data structure including data indicative of most likely transitions between nodes of a trellis diagram and input values associated with the most likely transitions. The data structure is used to produce the input values corresponding to the received symbols of the convolutional code. The program instructions include at least two add-compare-select (ACS) instructions specifying storage elements such that a processor executing the program instructions can simultaneously execute the add-compare-select instructions.

BRIEF DESCRIPTION OF THE DRAWINGS

The invention may be understood by reference to the following description taken in conjunction with the accompanying drawings, in which like reference numerals identify similar elements, and in which:

FIG. 6A is a diagram of one embodiment of the ACS instruction of FIG. 3;

FIG. 6B is a diagram of registers and the contents thereof before execution of a 'vit$_{13}$ a' Viterbi instruction, wherein the 'vit$_{13}$ a' Viterbi instruction is the ACS instruction of FIG. 6A;

FIG. 6C is a diagram of the registers of FIG. 6B and the contents thereof after execution of the 'vit$_{13}$ a' Viterbi instruction;

FIG. 11 is a flow chart of one embodiment of a method for decoding convolutional code.

DETAILED DESCRIPTION OF THE PREFERRED EMBODIMENTS

In the following disclosure, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art. It is further noted that all functions described herein may be performed in either hardware or software, or a combination thereof, unless indicated otherwise. Certain terms are used throughout the following description and claims to refer to particular system components. As one skilled in the art will appreciate, components may be referred to by different names. This document does not intend to distinguish between components that differ in name, but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical or communicative connection. Thus, if a first device couples to a second device, that connection may be through a direct connection, or through an indirect connection via other devices and connections.

Figure 3:
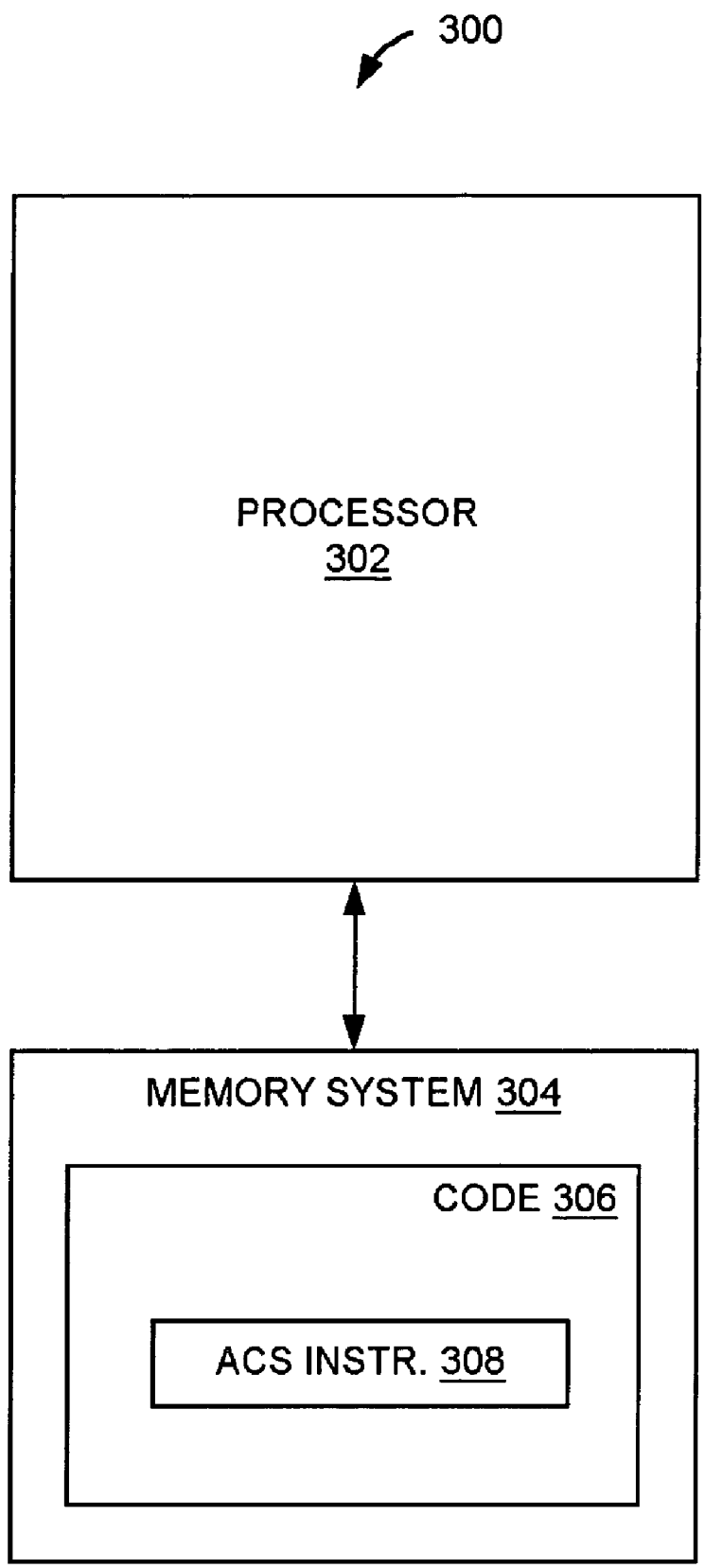
FIG. 3 is a diagram of one embodiment of a data processing system including a processor coupled to a memory system, wherein the memory system includes a software program (i.e., code) including an add-compare-select (ACS) instruction.

FIG. 3 is a diagram of one embodiment of a data processing system 300 including a processor 302 coupled to a memory system 304. In general, the processor 302 fetches and executes instructions of a predefined instruction set stored in the memory system 304. As illustrated in FIG. 3, the memory system 304 includes a software program (i.e., code) 306 including instructions from the instruction set. As indicated in FIG. 3, the code 306 includes an add-compare-select (ACS) instruction 308 of the instruction set.

As described in detail below, the add-compare-select (ACS) instruction specifies a destination register, a first pair of source registers, a second pair of source registers, and several operations. During an add operation specified by the ACS instruction 308, one register of the first pair of source registers is added to one register of the second pair of source registers, thereby forming a first sum, and the other register of the first pair of source registers is added to the other register of the second pair of source registers, thereby forming a second sum. A minimum of the first and second sums is stored in the destination register.

During a compare operation specified by the add-compare-select (ACS) instruction 308, the first and second sums are compared. An add-compare-select (ACS) register is updated during a select operation specified by the ACS instruction 308 dependent upon whether the first sum is less than, or greater than or equal to, the second sum.

As described below, the add-compare-select (ACS) instruction 308 finds particular use in decoding convolutional code. For example, the ACS instruction 308 may be used to carry out the computationally intensive ACS operation of the Viterbi decoding algorithm described above. For example, in an implementation of the Viterbi decoding algorithm, the first pair of source registers may be used to store path costs for a previous stage in a trellis diagram, and the second pair of source registers may be used to store branch costs for branches or transitions leading to a current stage. In this situation, minimum path cost is stored in the destination register, and the add-compare-select (ACS) register is updated during the select operation to specify the path with the minimum path cost.

The processor 302 may be, for example, one of several functional blocks or units (i.e., "cores") formed on an integrated circuit. It is now possible for integrated circuit designers to take highly complex functional units or blocks, such as processors, and integrate them into an integrated circuit much like other less complex building blocks.

Figure 4:
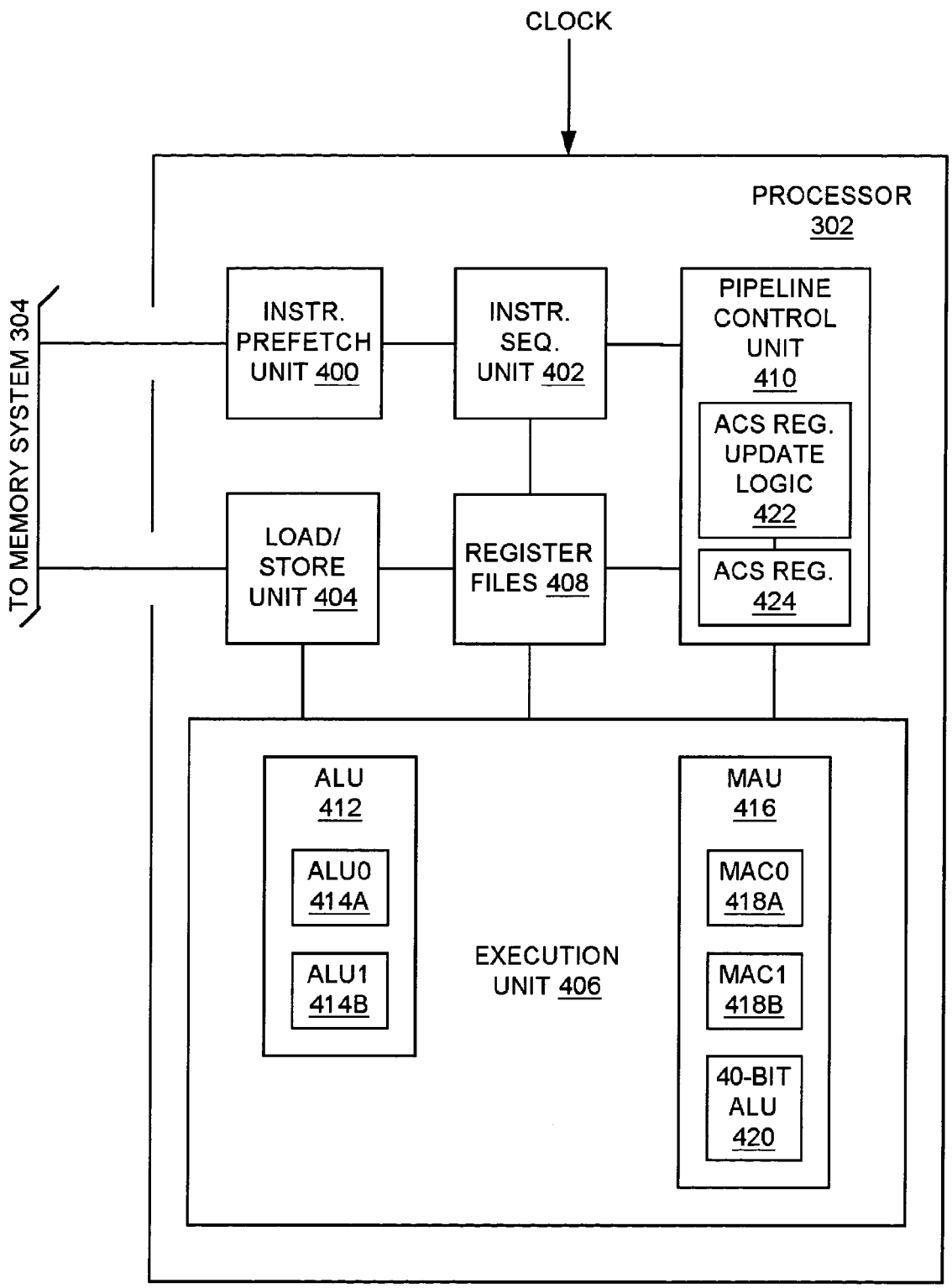
FIG. 4 is a diagram of one embodiment of the processor of FIG. 3, wherein the processor includes ACS register update logic coupled to an ACS register.

FIG. 4 is a diagram of one embodiment of the processor 302 of FIG. 3. As indicated in FIG. 4, the processor 302 receives a clock signal "CLOCK" and executes instructions dependent upon the CLOCK signal. Mores specifically, the processor 302 includes several functional units described below, and operations performed within the functional units are synchronized by the CLOCK signal.

In the embodiment of FIG. 4, the processor 302 includes an instruction prefetch unit 400, an instruction sequencing unit 402, a load/store unit (LSU) 404, an execution unit 406, register files 408, and a pipeline control unit 410. The instruction prefetch unit 400, the instruction sequencing unit 402, the load/store unit (LSU) 404, the execution unit 406, the register files 408, and the pipeline control unit 410 may be considered functional units of the processor 302, and may contain other functional units.

In the embodiment of FIG. 4, the processor 302 is a pipelined superscalar processor core. That is, the processor 302 implements an instruction execution pipeline including multiple pipeline stages, concurrently executes multiple instructions in different pipeline stages, and is also capable of concurrently executing multiple instructions in the same pipeline stage.

In general, the instruction prefetch unit 400 fetches instructions from the memory system 304 of FIG. 3, and provides the fetched instructions to the instruction sequencing unit 402. In one embodiment, the instruction prefetch unit 400 is capable of fetching up to 4 instructions at a time from the memory system 304, partially decodes and aligns the instructions, and stores the partially decoded and aligned instructions in an instruction cache within the instruction prefetch unit 400.

The instruction sequencing unit 402 receives (or retrieves) partially decoded instructions from the instruction cache of the instruction prefetch unit 400, fully decodes the instructions, and stores the fully decoded instructions in an instruction queue. In one embodiment, the instruction sequencing unit 402 is capable of receiving (or retrieving) multiple partially decoded instructions from the instruction cache of the instruction prefetch unit 400, and decoding the multiple partially decoded instructions, during a single cycle of the CLOCK signal.

In one embodiment, the instruction sequencing unit 402 translates instruction operation codes (i.e., opcodes) into native opcodes for the processor. The instruction sequencing unit 402 checks the multiple decoded instructions using grouping and dependency rules and provides (i.e., issues) one or more of the decoded instructions conforming to the grouping and dependency rules as a group to the load/store unit (LSU) 404 and/or the execution unit 406 for simultaneous execution.

The load/store unit (LSU) 404 is used to transfer data between the processor 302 and the memory system 304. In one embodiment, the load/store unit (LSU) 404 includes 2 independent load/store units. Each of the 2 independent load/store units accesses the memory system 304 via separate load/store buses, and includes a separate address generation unit (AGU) for generating and translating address signals needed to access values stored in the memory system 304.

The execution unit 406 is used to perform operations specified by instructions (and corresponding decoded instructions). In the embodiment of FIG. 4, the execution unit 406 includes an arithmetic logic unit (ALU) 412 and a multiply/accumulate unit (MAU) 416. The ALU 412 includes 2 independent arithmetic logic units (ALUs): a 16-bit ALU0 labeled 414A, and a 16-bit ALU1 labeled 414B. The MAU 416 includes 2 independent multiply/accumulate units (MACs): MAC0 labeled 418A, and MAC1 labeled 418B. The MAU 416 also includes a 40-bit arithmetic logic unit (ALU) 420.

In general, the register files 408 include one or more register files of the processor 302. In one embodiment, the register files 408 include an address register file and a general purpose register file. The address register file includes 8 32-bit address registers, and the general purpose register file includes 16 16-bit general purpose registers. The 16 16-bit registers of the general purpose register file can be paired to form 8 32-bit general purpose registers. The registers of the register files 408 may, for example, be accessed via read/write enable signals from the pipeline control unit 410.

In general, the pipeline control unit 410 controls an instruction execution pipeline implemented within the processor 302 and described in more detail below. In some embodiments, the pipeline control unit 410 includes an interrupt control unit. In the embodiment of FIG. 4, the pipeline control unit 410 includes an add-compare-select (ACS) register 424 and ACS register update logic 422 coupled to the ACS register 424. In general, the ACS register 424 is used to store a result produced during execution of the ACS instruction 308 of FIG. 3. The ACS register update logic 422 updates the ACS register 424 during execution of the ACS instruction 308 as described in more detail below.

Figure 5:
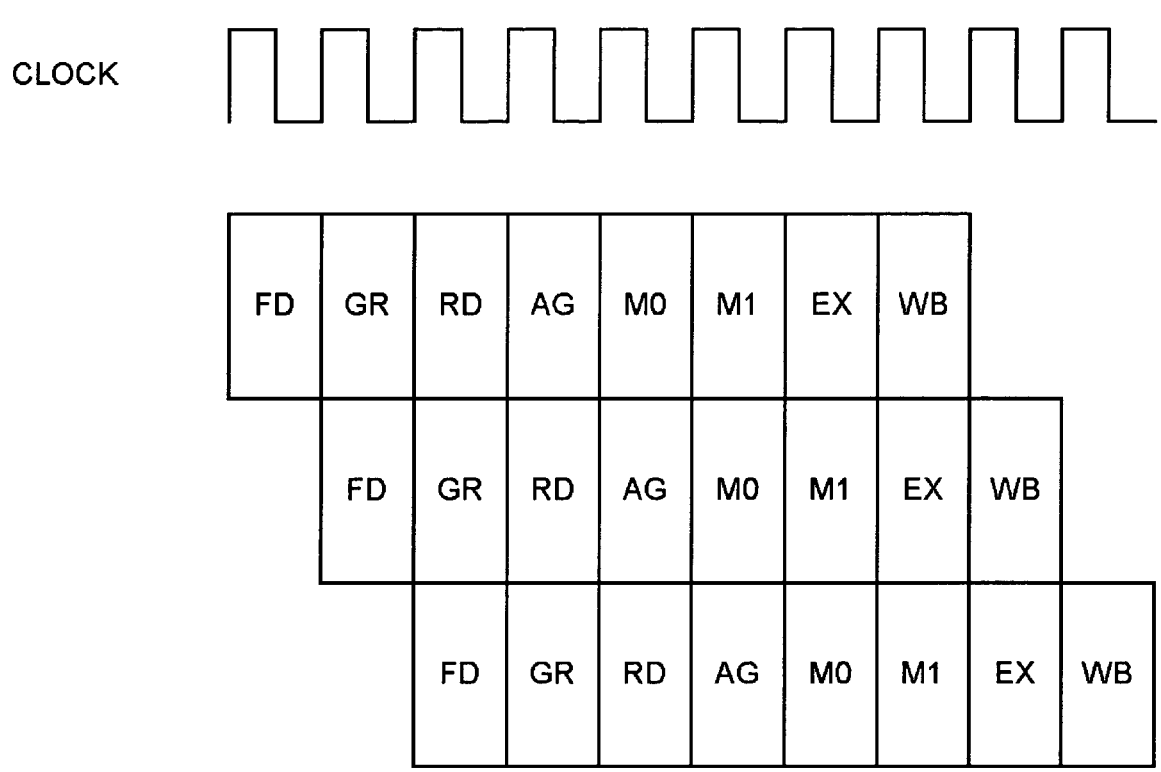
FIG. 5 is a diagram illustrating one embodiment of the instruction execution pipeline implemented within the processor of FIG. 4.

FIG. 5 is a diagram illustrating one embodiment of the instruction execution pipeline implemented within the processor 302 of FIG. 4 and controlled by the pipeline control unit 410 of FIG. 4. The instruction execution pipeline (pipeline) allows overlapped execution of multiple instructions. In the embodiment of FIG. 5, the pipeline includes 8 stages: a fetch/decode (FD) stage, a grouping (GR) stage, an operand read (RD) stage, an address generation (AG) stage, a memory access 0 (M0) stage, a memory access 1 (M1) stage, an execution (EX) stage, and a write back (WB) stage. As indicated in FIG. 5, operations in each of the 8 pipeline stages are completed during a single cycle of the CLOCK signal.

Referring to FIGS. 3, 4, and 5, the instruction fetch unit 400 fetches several instructions (e.g., up to 4 instructions) from the memory system 304 during the fetch/decode (FD) pipeline stage, partially decodes and aligns the instructions, and provides the partially decoded instructions to the instruction sequencing unit 402. The instruction sequencing unit 402 fully decodes the instructions and stores the fully decoded instructions in an instruction queue (described more fully later). The instruction sequencing unit 402 also translates the opcodes into native opcodes for the processor.

During the grouping (GR) stage, the instruction sequencing unit 402 checks the multiple decoded instructions using grouping and dependency rules, and passes one or more of the decoded instructions conforming to the grouping and dependency rules on to the read operand (RD) stage as a group. During the read operand (RD) stage, any operand values, and/or values needed for operand address generation, for the group of decoded instructions are obtained from the register files 408.

During the address generation (AG) stage, any values needed for operand address generation are provided to the load/store unit (LSU) 404, and the load/store unit (LSU) 404 generates internal addresses of any operands located in the memory system 304. During the memory address 0 (M0) stage, the load/store unit (LSU) 404 translates the internal addresses to external memory addresses used within the memory system 304.

During the memory address 1 (M1) stage, the load/store unit (LSU) 404 uses the external memory addresses to obtain any operands located in the memory system 304. During the execution (EX) stage, the execution unit 406 uses the operands to perform operations specified by the one or more instructions of the group. During a final portion of the execution (EX) stage, valid results (including qualified results of any conditionally executed instructions) are stored in registers of the register files 408.

During the write back (WB) stage, valid results (including qualified results of any conditionally executed instructions) of store instructions, used to store data in the memory system 304 as described above, are provided to the load/store unit (LSU) 404. Such store instructions are typically used to copy values stored in registers of the register files 408 to memory locations of the memory system 304.

As described above, in the embodiment of FIG. 3 the code 306 stored within the memory system 304 includes as add-compare-select (ACS) instruction 308 of the instruction set. In general, execution of the ACS instruction 308 by the processor 302 causes the processor 302 to perform an add-compare-select (ACS) operation.

FIGS. 6A–7C will now be used to illustrate exemplary embodiments of the add-compare-select (ACS) instruction 308 of FIG. 3. In the embodiments of FIGS. 6A–7C, the register files 408 of FIG. 4 includes an address register file and a general purpose register file. The address register file includes 8 32-bit address registers, and the general purpose register file includes 16 16-bit general purpose registers. The 16 16-bit general purpose registers are identified as 'rN', where $15 \geq N \geq 0$. The 16 16-bit registers of the general purpose register file can be paired to form 8 32-bit general purpose registers. The 8 32-bit general purpose register pairs are identified as 'rNe', where N={0, 2, 4, 6, 8, 10, 12, 14}. The 16 16-bit registers of the general purpose register file can also be paired to form 4 64-bit general purpose registers. The 4 64-bit general purpose register quads are identified as 'rNq', where N={0, 4, 8, 12}. Each of the 16 16-bit general purpose registers can be specified using 4 bits. Each of the 8 32-bit general purpose registers can be specified using 3 bits. Each of the 4 64-bit general purpose registers can be specified using 2 bits. Each of the 8 32-bit address register pairs can be specified using 3 bits. In addition, the add-compare-select (ACS) register 424 of FIG. 4 is a 32-bit register in the embodiments of FIGS. 6A–7C.

FIG. 6A is a diagram of one embodiment of the add-compare-select (ACS) instruction 308 of FIG. 3 wherein the add-compare-select (ACS) instruction 308 includes an opcode field 600, a destination register field 602, a source register 1 field 604, and a source register 2 field 606. The opcode field 600 contains a value identifying the instruction as an add-compare-select (ACS) instruction and specifying the particular add-compare-select (ACS) instruction format of FIG. 6A.

Herein below, the add-compare-select (ACS) instruction 308 of FIG. 6A will be referred to as a "Viterbi instruction for point a" or "vit_a" instruction, and the add-compare-select (ACS) register 424 of FIG. 4 will be referred to as a Viterbi register 'vitr'.

An assembly language syntax of the vit_a instruction is 'vit_a rZ,rXe,rYe'. A pseudo code description of the vit_a instruction is:

$rZ = \min \{(rX+rY), (r(X+1)+r(Y+1))\}$ if ((rX+rY)<(r(X+1)+r(Y+1)))
   {vitr=vitr<<1|0x00000001}
else
   {vitr=vitr<<1}

The destination register field 602 identifies the destination register 'rZ' into which a minimum value of the set {(rX+rY), (r(X+1)+r(Y+1))} is to be saved, where Z={0, 1, 2, 3}. The source 1 register field 604 identifies a source register 1 'rXe' including registers 'rX' and 'r(X+1)', and the source 2 register field 606 identifies a source register 2 'rYe' including registers 'rY' and 'r(Y+1)'. As indicated in the pseudo code description of the vit_a instruction, the 32-bit Viterbi register 'vitr' (i.e., the add-compare-select or ACS register 424 of FIG. 4) is updated dependent upon a first pair of values stored in the registers 'rX' and 'r(X+1)' specified by the source register 1 'rXe' and a second pair of values stored in the registers 'rY' and 'r(Y+1)' specified by the source register 2 'rYe'.

FIG. 6B is a diagram of registers and the contents thereof before execution of the Viterbi instruction 'vit_a r0,r4,r6' specifying destination register 'r0', source register 1 {r5, r4}, and source register 2 {r7, r6}. As indicated in FIG. 6B, the contents of the destination register 'r0' before execution of the Viterbi instruction is 'xxxx' indicating the value doesn't matter. Prior to execution of the Viterbi instruction, register 'r5' contains the value '0x1123', register 'r4' contains the value '0x0030', register 'r7' contains the value '0x000a', register 'r6' contains the value '0x0008', and the Viterbi register 'vitr' contains the value '0x00000000'.

FIG. 6C is a diagram of the registers of FIG. 6B and the contents thereof after execution of the Viterbi instruction 'vit_a r0,r4,r6'. As indicated in FIG. 6C, the contents of the destination register 'r0' after execution of the Viterbi instruction is '0x0038'. This is a result of the operation 'r0=min {(r4+r6), (r5+r7)}' where (r4+r6)=0x0038 and (r5+r7)=0x112d. Following execution of the Viterbi instruction, the contents of the source register 1 {r5, r4} and the source register 2 {r7, r6} are unchanged.

After execution of the Viterbi instruction, the Viterbi register 'vitr' contains the value '0x00000001' as a result of the operation 'vitr=vitr<<1|0x00000001'. During the operation 'vitr vitr<<1|0x00000001' the contents of the bit positions of the 'vitr' register are shifted to the left one bit position, then the resulting value is logically ORed with '0x00000001'. This logical ORing has the same effect as adding the value '1' to the left-shifted contents of the 'vitr' register.

Figures 7A, 7B, 7C:
FIG. 7A is a diagram of another embodiment of the add-compare-select (ACS) instruction of FIG. 3.
FIG. 7B is a diagram of registers and the contents thereof before execution of a 'vit$_{13}$ b' Viterbi instruction, wherein the 'vit$_{13}$ b' Viterbi instruction is the ACS instruction of FIG. 7A.
FIG. 7C is a diagram of the registers of FIG. 7B and the contents thereof after execution of the 'vit$_{13}$ b' Viterbi instruction.

FIG. 7A is a diagram of another embodiment of the add-compare-select (ACS) instruction 308 of FIG. 3. In the embodiment of FIG. 7A, the add-compare-select (ACS) instruction 308 includes an opcode field 700, a destination register field 702, a source register 1 field 704, and a source register 2 field 706. The opcode field 700 contains a value identifying the instruction as an add-compare-select (ACS) instruction and specifying the particular add-compare-select (ACS) instruction format of FIG. 7A.

Herein below, the add-compare-select (ACS) instruction 308 of FIG. 7A will be referred to as a "Viterbi instruction for point b" or "vit_b" instruction.

An assembly language syntax of the vit_b instruction is 'vit_b rZ,rXe,rYe'. A pseudo code description of the vit_b instruction is:

$$rZ=\min\{(rX+r(Y+1)), (r(X+1)+rY)\}$$

if ((rX+r(Y+1))<(r(X+1)+rY))
  {vitr=vitr<<1|0x00000001}
else
  {vitr=vitr<<1}

The destination register field 702 identifies the destination register 'rZ' into which a minimum value of the set {(rX+r(Y+1)), (r(X+1)+rY)} is to be saved, where Z={0, 1, 2, 3}. The source 1 register field 604 identifies a source register 1 'rXe' including registers 'rX' and 'r(X+1)', and the source 2 register field 606 identifies a source register 2 'rYe' including registers 'rY' and 'r(Y+1)'. As indicated in the pseudo code description of the vit_b instruction, the 32-bit Viterbi register 'vitr' (i.e., the add-compare-select or ACS register 424 of FIG. 4) is updated dependent upon a first pair of values stored in the registers 'rX' and 'r(X+1)' specified by the source register 1 'rXe' and a second pair of values stored in the registers 'rY' and 'r(Y+1)' specified by the source register 2 'rYe'.

FIG. 7B is a diagram of registers and the contents thereof before execution of the Viterbi instruction 'vit_b r1,r4,r6' specifying destination register 'r1', source register 1 {r5, r4}, and source register 2 {r7, r6}. As indicated in FIG. 7B, the contents of the destination register 'r1' before execution of the Viterbi instruction is 'xxxx' indicating the value doesn't matter. Prior to execution of the Viterbi instruction, register 'r5' contains the value '0x8000', register 'r4' contains the value '0xff30', register 'r7' contains the value '0x000a', register 'r6' contains the value '0xff00', and the Viterbi register 'vitr' contains the value '0x00000001'.

FIG. 7C is a diagram of the registers of FIG. 7B and the contents thereof after execution of the Viterbi instruction 'vit_b r1,r4,r6'. As indicated in FIG. 7C, the contents of the destination register 'r1' after execution of the Viterbi instruction is '0x7f00'. This is a result of the operation 'r0=min {(r4+r7), (r5+r6)}' where (r4+r7)=0xff3a and (r5+r6)=0x7f00. Following execution of the Viterbi instruction, the contents of the source register 1 {r5, r4} and the source register 2 {r7, r6} are unchanged.

After execution of the Viterbi instruction, the Viterbi register 'vitr' contains the value '0x00000002' as a result of the operation 'vitr=vitr<<1' during which the contents of the bit positions of the 'vitr' register are shifted to the left one bit position.

Referring back to FIG. 4, the instruction sequencing unit 402 is capable of grouping up to 2 Viterbi instructions (i.e., up to 2 add-compare-select or ACS instructions 308 of FIGS. 3, 6A, and/or 7A) for simultaneous execution. When the instruction sequencing unit 402 groups 2 Viterbi instructions for simultaneous execution, the instruction sequencing unit 402 issues one of the Viterbi instructions to the arithmetic logic (ALU) 412 and the other Viterbi instruction to the multiply accumulate unit (MAU) 416. The Viterbi instruction issued to the ALU 412 is executed by the ALU0 414A or the ALU1 414B. The other Viterbi instruction issued to the MAU 416 is executed by the 40-bit ALU 420.

Figure 8:
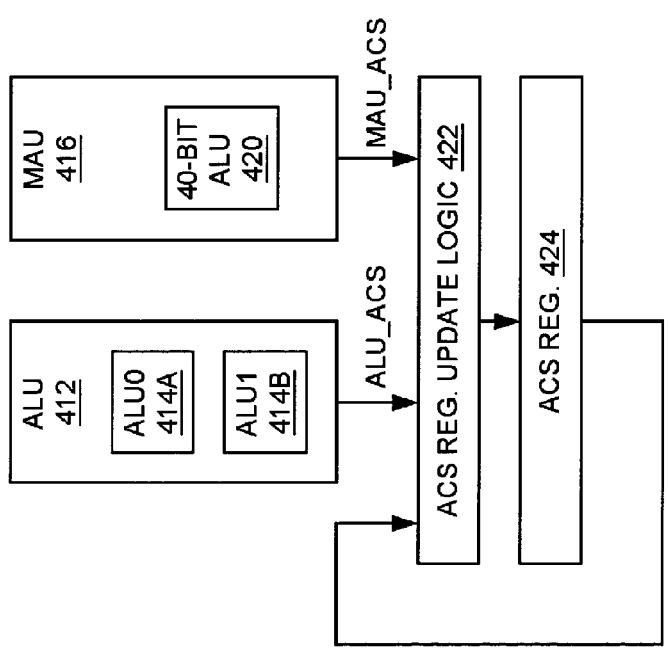
FIG. 8 is a diagram illustrating how the ACS register update logic updates the ACS register of FIG. 4 during execution of one or more ACS instructions of FIGS. 3, 6A, and/or 7A.
Figure 9:
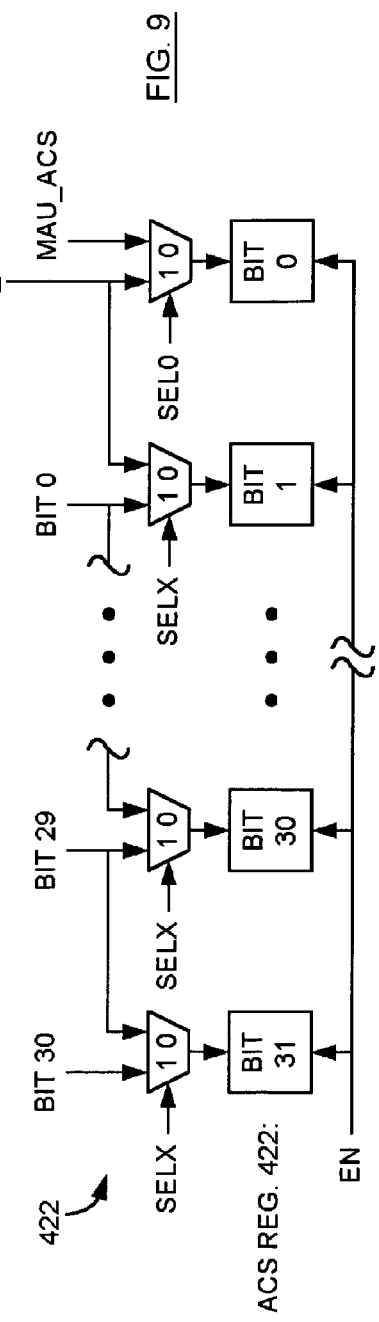
FIG. 9 is a diagram of one embodiment of the ACS register update logic of FIGS. 4 and 8.

FIGS. 8 and 9 will now be used to describe the operation of the ACS register update logic 422 of FIG. 4. FIG. 8 is a diagram illustrating how the ACS register update logic 422 updates the ACS register 424 of FIG. 4 during execution of one or more ACS instructions 308 of FIGS. 3, 6A, and/or 7A. As described above, up to 2 Viterbi instructions (i.e., up to 2 add-compare-select or ACS instructions 308 of FIGS. 3, 6A, and/or 7A) can be executed simultaneously. When a Viterbi instruction is issued to the arithmetic logic unit (ALU) 412, the Viterbi instruction is executed by the ALU0 414A or the ALU1 414B, and the ALU 412 produces a signal "ALU_ACS" conveying a value to be stored in a bit (e.g., a least significant bit 0) of the Viterbi register 'vitr' (i.e., the ACS register 424). As indicated in FIG. 8, the ALU 412 provides the signal ALU_ACS to the ACS register update logic 422.

When a Viterbi instruction (i.e., an add-compare-select or ACS instruction 308 of FIGS. 3, 6A, and/or 7A) is issued to the arithmetic logic unit (ALU) 412, and another Viterbi instruction is not simultaneously issued to the multiply/accumulate unit (MAU) 416, the ACS register update logic 422 effectively shifts the contents of the Viterbi register 'vitr' (i.e., the ACS register 424) one bit position to the left (i.e., in a direction of increasing significance), and stores the value conveyed by the signal ALU_ACS in the least significant bit 0 of the Viterbi register 'vitr'.

Similarly, when a Viterbi instruction is issued to the multiply/accumulate unit (MAU) 416, the Viterbi instruction is executed by the 40-bit arithmetic logic unit (ALU) 420 of the MAU 416, and the MAU 416 produces a signal "MAU_ACS" conveying a value to be stored in a bit (e.g., the least significant bit 0) of the Viterbi register 'vitr' (i.e., the ACS register 424). As indicated in FIG. 8, the MAU 416 provides the signal MAU_ACS to the ACS register update logic 422.

When a Viterbi instruction (i.e., an add-compare-select or ACS instruction 308 of FIGS. 3, 6A, and/or 7A) is issued to the multiply/accumulate unit (MAU) 416, and another Viterbi instruction is not simultaneously issued to the arithmetic logic unit (ALU) 412, the ACS register update logic 422 effectively shifts the contents of the Viterbi register 'vitr' (i.e., the ACS register 424) one bit position to the left, and stores the value conveyed by the signal MAU_ACS in the least significant bit 0 of the Viterbi register 'vitr'.

Figure 1:
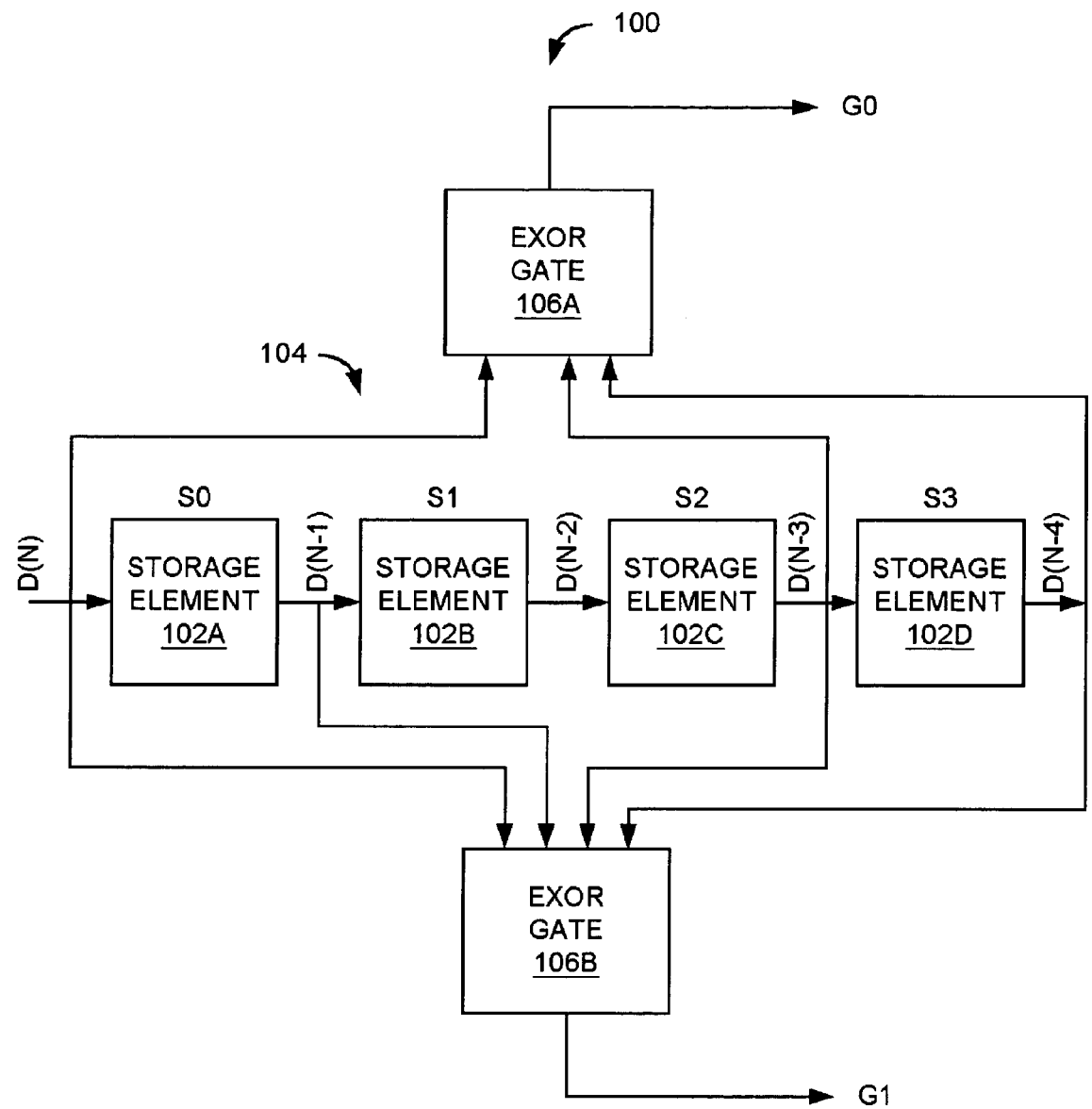
FIG. 1 is a diagram of one embodiment of a convolutional encoder.

In the embodiments of FIGS. 4, 8, and 9, when the instruction sequencing unit 402 of FIG. 4 issues Viterbi instructions (i.e., add-compare-select or ACS instructions 308 of FIG. 3) to both the arithmetic logic unit (ALU) 412 and the multiply/accumulate unit (MAU) 416 for simultaneous execution, the instruction sequencing unit 402 issues the Viterbi instruction existing first in program order in the code 306 of FIG. 1 (i.e., the "oldest" of the Viterbi instructions) to the ALU 412, and issues the other Viterbi instruction (i.e., the "youngest" of the Viterbi instructions) to the MAU 416. Accordingly, when Viterbi instructions are issued to both the arithmetic logic unit (ALU) 412 and the multiply/accumulate unit (MAU) 416 for simultaneous execution, the ACS register update logic 422 effectively shifts the contents of the Viterbi register 'vitr' (i.e., the ACS register 424) two bit positions to the left, stores the value conveyed by the signal ALU_ACS in the bit 1 of the Viterbi register 'vitr', and stores the value conveyed by the signal MAU_ACS in the least significant bit 0 of the Viterbi register 'vitr'.

FIG. 9 is a diagram of one embodiment of the add-compare-select (ACS) register update logic 422 of FIGS. 4 and 8. In FIG. 9, the ACS register update logic 422 is shown coupled to the ACS register 424 of FIGS. 4 and 8. In the embodiment of FIG. 9, the ACS register update logic 422 includes 32 2-input multiplexers, one for each bit position of the 32-bit ACS register 424. In FIG. 9, the 32 bit positions of the ACS register 424 are numbered from 0 to 31, with bit 31 being the most significant bit position and bit 0 being the least significant bit position. The multiplexer corresponding to bit n of the ACS register 424, where $31 \leq n \leq 2$, receives the values of bits (n−1) and (n−2) of the ACS register 424 at the input terminals. The multiplexer corresponding to bit 1 of the ACS register 424 receives the value of bit 0 of the ACS register 424 at one input terminal, and the signal ALU_ACS from the arithmetic logic unit (ALU) 412 at the other input terminal. The multiplexer corresponding to bit 0 of the ACS register 424 receives the signal MAU_ACS from the multiply/accumulate unit (MAU) 416 at one input terminal, and the signal ALU_ACS from the ALU 412 at the other input terminal.

As indicated in FIG. 9, the multiplexer corresponding to bit n of the ACS register 424, where $31 \leq n \leq 1$, receives a select signal "SELX" at a control terminal, and the multiplexer corresponding to bit 0 of the ACS register 424 receives a select signal "SEL0" at a control terminal. In addition, each bit position of the ACS register 424 receives an enable signal "EN."

When a Viterbi instruction (i.e., an add-compare-select or ACS instruction 308 of FIGS. 3, 6A, and/or 7A) is issued to the arithmetic logic unit (ALU) 412, and another Viterbi instruction is not simultaneously issued to the multiply/accumulate unit (MAU) 416, the select signal SELX is a logic '1', the select signal SEL0 is a logic '1', and the enable signal EN is a logic '1'. As a result, the multiplexer corresponding to bit n of the ACS register 424, where $31 \leq n \leq 2$, produces the value of bit (n−1) of the ACS register 424 at an output terminal, and the value of bit (n−1) is stored in bit n of the ACS register 424. The multiplexer corresponding to bit 1 of the ACS register 424 produces the value of bit 0 of the ACS register 424 at an output terminal, and the value of bit 0 is stored in bit 1 of the ACS register 424. The multiplexer corresponding to bit 0 of the ACS register 424 produces the value of the signal ALU_ACS from the arithmetic logic unit (ALU) 412 at an output terminal, the value of the signal ALU_ACS is stored in bit 0 of the ACS register 424. As described above, the ACS register update logic 422 effectively shifts the contents of the Viterbi register 'vitr' (i.e., the ACS register 424) one bit position to the left (i.e., in a direction of increasing significance), and stores the value conveyed by the signal ALU_ACS in the least significant bit 0 of the Viterbi register 'vitr'.

When a Viterbi instruction (i.e., an add-compare-select or ACS instruction 308 of FIGS. 3, 6A, and/or 7A) is issued to the multiply/accumulate unit (MAU) 416, and another Viterbi instruction is not simultaneously issued to the arithmetic logic unit (ALU) 412, the select signal SELX is a logic '1', the select signal SEL0 is a logic '0', and the enable signal EN is a logic '1'. As a result, the multiplexer corresponding to bit n of the ACS register 424, where $31 \leq n \leq 2$, produces the value of bit (n−1) of the ACS register 424 at the output terminal, and the value of bit (n−1) is stored in bit n of the ACS register 424. The multiplexer corresponding to bit 1 of the ACS register 424 produces the value of bit 0 of the ACS register 424 at an output terminal, and the value of bit 0 is stored in bit 1 of the ACS register 424. The multiplexer corresponding to bit 0 of the ACS register 424 produces the value of the signal MAU_ACS from the multiply/accumulate unit (MAU) 416 at the output terminal, and the value of the signal MAU_ACS is stored in bit 0 of the ACS register 424. As described above, the ACS register update logic 422 effectively shifts the contents of the Viterbi register 'vitr' (i.e., the ACS register 424) one bit position to the left, and stores the value conveyed by the signal MAU_ACS in the least significant bit 0 of the Viterbi register 'vitr'.

When Viterbi instructions (i.e., add-compare-select or ACS instructions 308 of FIG. 3) are issued to both the arithmetic logic unit (ALU) 412 and the multiply/accumulate unit (MAU) 416 for simultaneous execution, the select signal SELX is a logic '0', the select signal SEL0 is a logic '0', and the enable signal EN is a logic '1'. As a result, the multiplexer corresponding to bit n of the ACS register 424, where $31 \leq n \leq 2$, produces the value of bit (n−2) of the ACS register 424 at an output terminal, and the value of bit (n−2) is stored in bit n of the ACS register 424. The multiplexer corresponding to bit 1 of the ACS register 424 produces the value of the signal ALU_ACS from the arithmetic logic unit (ALU) 412 at the output terminal, and the value of the signal ALU_ACS is stored in bit 1 of the ACS register 424. The multiplexer corresponding to bit 0 of the ACS register 424 produces the value of the signal MAU_ACS from the multiply/accumulate unit (MAU) 416 at the output terminal, the value of the signal MAU_ACS is stored in bit 0 of the ACS register 424. As described above, the ACS register update logic 422 effectively shifts the contents of the Viterbi register 'vitr' (i.e., the ACS register 424) two bit positions to the left, stores the value conveyed by the signal ALU_ACS in the bit 1 of the Viterbi register 'vitr', and stores the value conveyed by the signal MAU_ACS in the least significant bit 0 of the Viterbi register 'vitr'.

Viterbi Decoder Implementation

In one embodiment, the data processing system 300 of FIG. 3 is advantageously used to implement a Viterbi decoder of a Global System for Mobile Communications (GSM) voice channel. In this situation, the instructions of the code 306 of FIG. 3 embody the popular Viterbi decoding algorithm. In executing the instructions of the code 306, the processor 302 of FIG. 3 decodes an encoded input data stream.

The GSM operates on 50 frames of speech data per second, with each frame containing N=189 bits that need to be protected by forward error correction. The known convolutional encoder 100 of FIG. 1 may be used as a convolutional encoder of the GSM voice channel. As described above, the encoder 100 is a rate ½ encoder (2 output bits for every input bit) having a constraint length of K=5 and including 4 storage elements 102A–102D. Each of the 4 storage elements 102A–102D represents a different one of 4 state elements S0–S3. The state elements S0–S3 define 2⁴=16 unique states given by the state element grouping "S3S2S1S0."

When used as the convolutional encoder of the GSM voice channel, the encoder 100 generates 378 output bits for each frame. For each data block, the encoder 100 starts in a state '0' (S3S2S1S0=0000) with all 4 storage elements 102A–102D storing logic '0'. After each data block, the encoder 100 is reset to the state '0' via 4 sequential trailing logic '0's included as "tail bits" of the input data frame. As described above, the trellis diagram including the portion 200 of FIG. 2 may be used to represent the convolutional encoding performed by the convolutional encoder 100 and/or the decoding of the convolutional code produced by the encoder 100 (i.e., the decoding performed by the data processing system 300 of FIG. 3).

When used to implement the Viterbi decoder of the GSM voice channel, the operation of the data processing system 300 of FIG. 3 may be described as finding an optimal path through an M-state, N-stage trellis diagram, then tracing back through the trellis diagram to generate the N decoded output bits. In general, the number of potential paths in a trellis diagram doubles at each stage. As described above, the GSM voice channel has a corresponding trellis diagram with N=189 stages. If the decoder implemented by the data processing system 300 had to examine each potential path in the trellis diagram, the amount of processing and memory required would make the decoder impractical.

Figure 2:
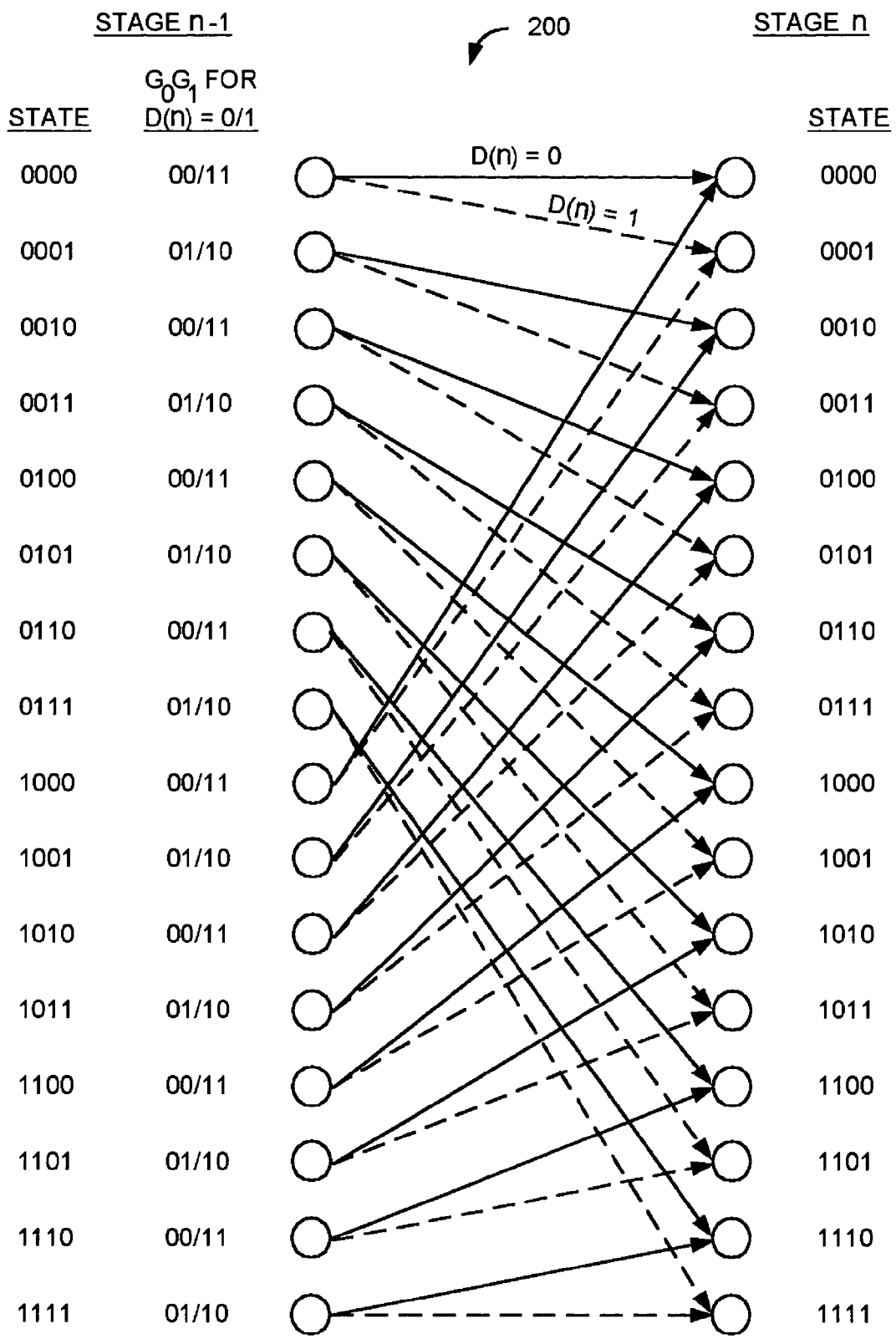
FIG. 2 is a diagram of a portion of a trellis diagram corresponding to the convolutional encoder of FIG. 1.

With the Viterbi algorithm, however, only the most likely paths in the trellis diagram "survive" at each stage. As a result, at most M paths survive, regardless of the number of stages. At each stage, a cost metric is used to select a "survivor" path from among the two incoming paths to each state (i.e., node); As described above, a "branch" is a transition between states (i.e., nodes). In FIG. 2, arrows between the states or nodes represent transitions or branches between the states or nodes.

Figure 10:
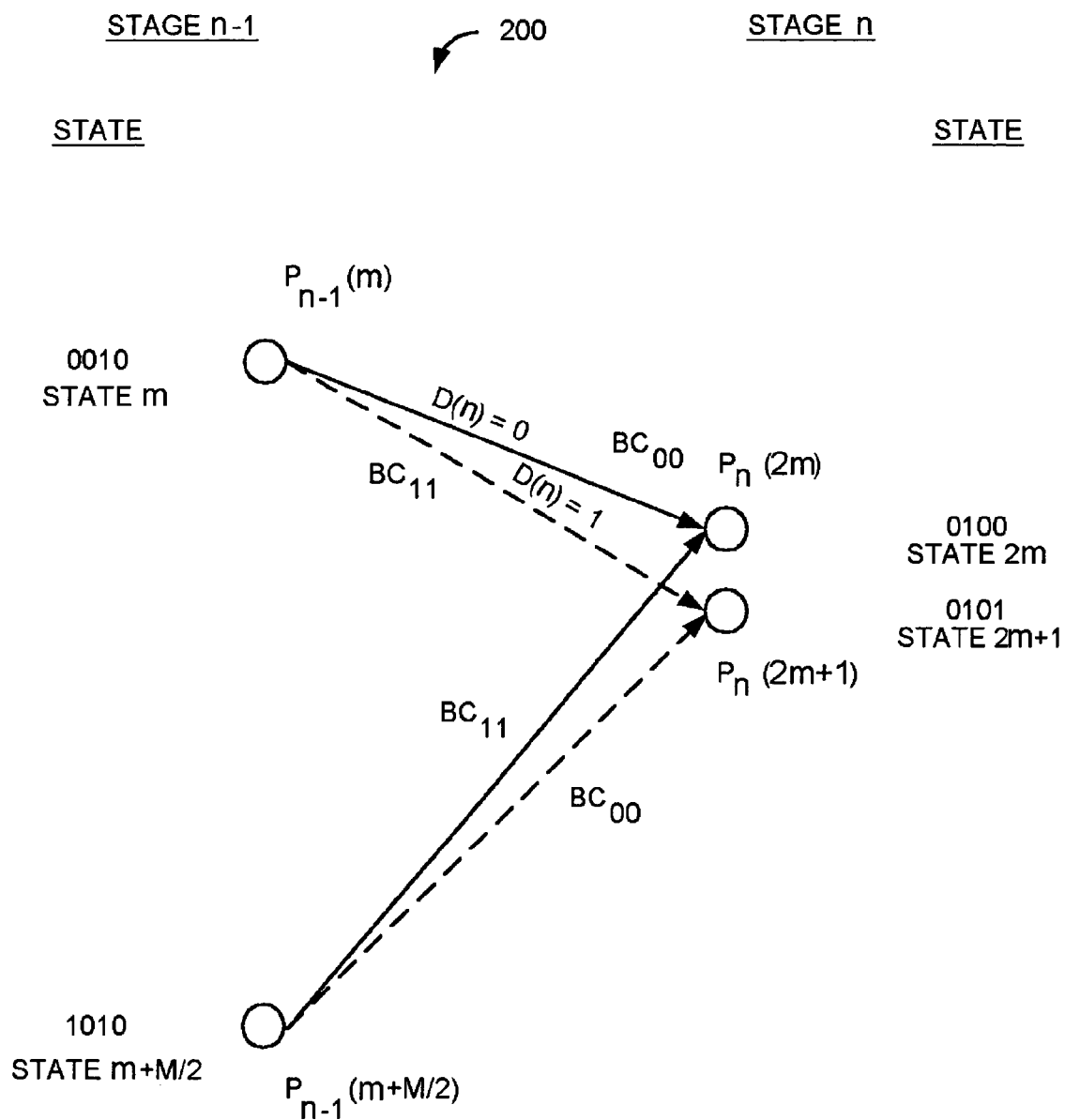
FIG. 10 is a part of the portion of the trellis diagram of FIG. 2, and illustrates branch and path costs associated with one of 8 "butterfly" structures existing in the portion of the trellis diagram of FIG. 2.

In one embodiment of the Viterbi decoder implemented by the data processing system 300 of FIG. 3, decoding complexity is reduced by using the Manhattan distance cost metric for branch cost calculations. FIG. 10 is a part of the portion 200 of the trellis diagram of FIG. 2, and illustrates branch and path costs. As illustrated in FIG. 10, each state or node 2m in stage n, where $0 \leq m \leq 7$, has an incoming path from a state or node m in the preceding stage (n−1), and another incoming path from a state or node (m+M/2) in the stage (n−1), where M is the total number of states (16). A branch cost "$BC_{00}$" is associated with the transition or branch from state or node m in stage (n−1) to the state or node 2m in stage n, and a branch cost "$BC_{11}$" is associated with the transition or branch from state or node (m+M/2) in stage (n−1) to the state or node 2m in stage n.

Using the Manhattan distance cost metric, and where the set {Xn, Yn} is the decoder input value $G_0G_1$ (i.e., the decoder input symbol) at a stage n of the trellis diagram, the branch cost values $BC_{00}$ and $BC_{01}$ are calculated according to the following equations:

$$BC_{00} = Xn + n, \text{ and}$$

$$BC_{11} = -BC_{00} = -Xn - Yn$$

The branch cost subscripts '00' and '11' indicate that in states 2 (i.e., '0010') and 10 (i.e., '1010') of stage (n−1), the possible decoder input symbols (i.e., values $G_0G_1$ produced by the encoder) are 00 and 11. (See FIG. 2.) In other states of stage (n−1), the possible decoder input values $G_0G_1$ are 01 and 10. (See FIG. 2.) A branch cost $BC_{01}$ corresponds to transitions or branches results when the decoder input symbol=01, and a branch cost $BC_{10}$ corresponds to transitions or branches results when the decoder input symbol=10:

$$BC_{01} = Xn - Yn, \text{ and}$$

$$BC_{10} = -BC_{01} = -Xn + Yn$$

Symmetry in the Trellis diagram is used to reduce the number of branch cost calculations. For example, as illustrated in FIG. 10, each state or node (2m+1) in stage n has an incoming path from the state or node m in the preceding stage (n−1), and another incoming path from the state or node (m+M/2) in the stage (n−1). The branch cost $BC_{00}$ described above is also associated with the transition or branch from state or node m in stage (n−1) to the state or node (2m+1) in stage n as indicted in FIG. 10. Similarly, the branch cost $BC_{11}$ described above is also associated with the transition or branch from state or node (m+M/2) in stage (n−1) to the state or node (2m+1) in stage n.

FIG. 10 illustrates one of 8 "butterfly" structures existing in the portion of the trellis diagram of FIG. 2. In the butterfly structure of FIG. 10, the states 2m and (2m+1) in stage (n−1) are paired with states 2m and (2m+1) in stage n reduce the required number of calculations. For example, in FIG. 10, although there are four transitions or branches to the states 2m and (2m+1) in stage n, the branch costs corresponding to pairs of the transitions or branches are the same such that only 2 branch costs need be computed. Further, it is noted that $BC_{11} = -BC_{00}$, thus only $BC_{00}$ (or $BC_{11}$) need be computed.

In Viterbi decoding, inputs to the decoder represent the logarithmic probability of a '0' or a '1' transition. "Soft decision" inputs are represented with multiple bits per transition, while "hard decision" inputs use a single bit. Using either approach, the branch metric of a transition is the logarithmic probability of the transition. The path metric is the logarithmic probability of a sequence of transitions, and can be calculated as a sum of branch metrics.

Path metrics or costs for each new state are calculated by summing a previous computed path cost, associated with a previous state in the preceding stage having a transition or branch to the new state, with a branch cost associated with the transition or branch to the new state. In Viterbi decoding, the incoming path having the minimum path cost is selected as the survivor path.

In FIG. 10, a path cost "Pn−1(m)" is associated with state m in stage (n−1), and path cost "Pn−1(m+M/2)" is associated with state (m+M/2) in stage (n−1). Similarly, path cost "Pn(2m)" is associated with state 2m in stage n, and path cost "Pn(2m+1)" is associated with state (2m+1) in stage n.

In Viterbi decoding, "butterfly computations" involve two add-compare-select (ACS) operations, and updating of a survivor path history. Referring to FIG. 10, the two ACS operations may be described as:

$$P_n(2m) = \min\{P_{n-1}(m) + BC_{00}, P_{n-1}(m+M/2) + BC_{11}\},$$
and $$P_n(2m+1) = \min\{P_{n-1}(m) + BC_{11}, P_{n-1}(m+M/2) + BC_{00}\}.$$

In general, after completing N stages of Viterbi decoding, one of the M survivor paths is selected for traceback. However, as GSM encoding includes the 4 '0' tail bits to reset the encoder to state '0' there is no need to calculate the shortest of the M paths13 the state '0' is selected to begin traceback.

The above described add-compare-select (ACS) operations for selecting the survivor paths are the most computationally intensive operations performed by the data processing system 300 of FIG. 3 in implementing the Viterbi decoder of the GSM voice channel. By virtue of the ability of the processor 302 of FIG. 3 to simultaneously execute up to 2 add-compare-select (ACS) instructions 308 of FIG. 3, the Viterbi decoder implemented by the data processing system 300 of FIG. 3 is highly efficient.

In the embodiments of FIGS. 6A and 7A, the inputs to the add-compare-select (ACS) instructions 308 of FIG. 3 are two register pairs. The first register pair specified by the extended register 'rXe' contains path costs for a previous stage, and the other register pair specified by the extended register 'rYe' contains branch costs for transitions or branches leading to a current stage. The bits of the ACS register 424 of FIG. 4 are used to record the survivor branches (as '0' or '1') selected during executions of the ACS instructions 308.

In one embodiment of the processor 302 of FIG. 3, each of the 2 address generation units (AGUs) of the load/store unit 404 has its own 24-bit address bus, 32-bit load data bus, and 32-bit store data bus. Either of the two data load busses or store data busses can be concatenated for 64-bit data transfers. In this embodiment, the processor 302 supports a peak data bandwidth of 128 bits per cycle, and a sustained bandwidth of 64 bits per cycle. In one embodiment of a method for of decoding convolution code described below, a peak data throughput of 96 bits per cycle may be achieved by the data processing system 300 of FIG. 3 when the processor 302 of FIG. 3 executes 2 add-compare-select (ACS) instructions 308 of FIG. 3 simultaneously, and in the absence of memory cycle stalls.

The processor 302 of FIG. 3 preferably includes known hardware support for circular buffers, and circular buffers are preferably used in implementing the Viterbi decoder to minimize path cost pointer management costs. If a pointer used for circular addressing is updated beyond the address range of a circular buffer, the address preferably wraps around to a valid circular buffer location.

FIG. 11 is a flow chart of one embodiment of a method 1100 for decoding convolutional code. During a step 1102 of the method 1100, computer program code is generated for a processor (e.g., the processor 302 of FIGS. 3 and 4) including two or more add-compare-select (ACS) instructions. The storage elements specified by each of the ACS instructions are selected such that there are no storage element conflicts and the processor will simultaneously execute the ACS instructions.

As described above, the processor 302 of FIGS. 3 and 4 includes multiple registers and is configured to simultaneously execute multiple ACS instructions dependent upon a set of instruction grouping rules. Each ACS instruction specifies a subset of the storage elements. In general, the instruction grouping rules avoid dependencies between instructions available for execution, including storage element conflicts. The storage elements specified by each of the ACS instructions of the computer program code may be selected such that there are no storage element conflicts, the grouping rules are met, and the processor will simultaneously execute the at least two ACS instructions.

The computer program code includes instructions that, when executed by the processor, causes the processor to: (i) receive symbols of the convolutional code in sequence, wherein each symbol has a corresponding input value used to generate the symbol, (ii) use the received symbols to build a data structure including data indicative of most likely transitions between nodes of a trellis diagram and input values associated with the most likely transitions, and (iii) use the data structure to produce the input values corresponding to the received symbols of the convolutional code. Execution of the computer program code by the processor is initiated during a step 1106.

Regarding the building of the data structure, the computer program code may include instructions that cause the processor to performing the following for each symbol of the convolutional code: (i) determine likelihoods of transitions between nodes of a trellis diagram, (ii) select most likely transitions to nodes in a current stage of the trellis diagram, and (iii) modify the data structure to reflect the most likely transitions and the input values associated with the most likely transitions.

Viterbi GSM Decoder Using ZSP500 Digital Signal Processor

The processor 302 of FIGS. 3 and 4 may be, for example, a ZSP500 digital signal processor (LSI Logic Corp., Milpitas, Calif.). A Viterbi decoder for GSM speech channel decoding was implemented in a data processing system including a ZSP500 digital signal processor (DSP) coupled to a memory system (e.g., the memory system 304 of FIG. 3). A 32-element data structure was allocated in the memory system and used to store path costs in decoding stages of the Viterbi decoder.

Figure 12:
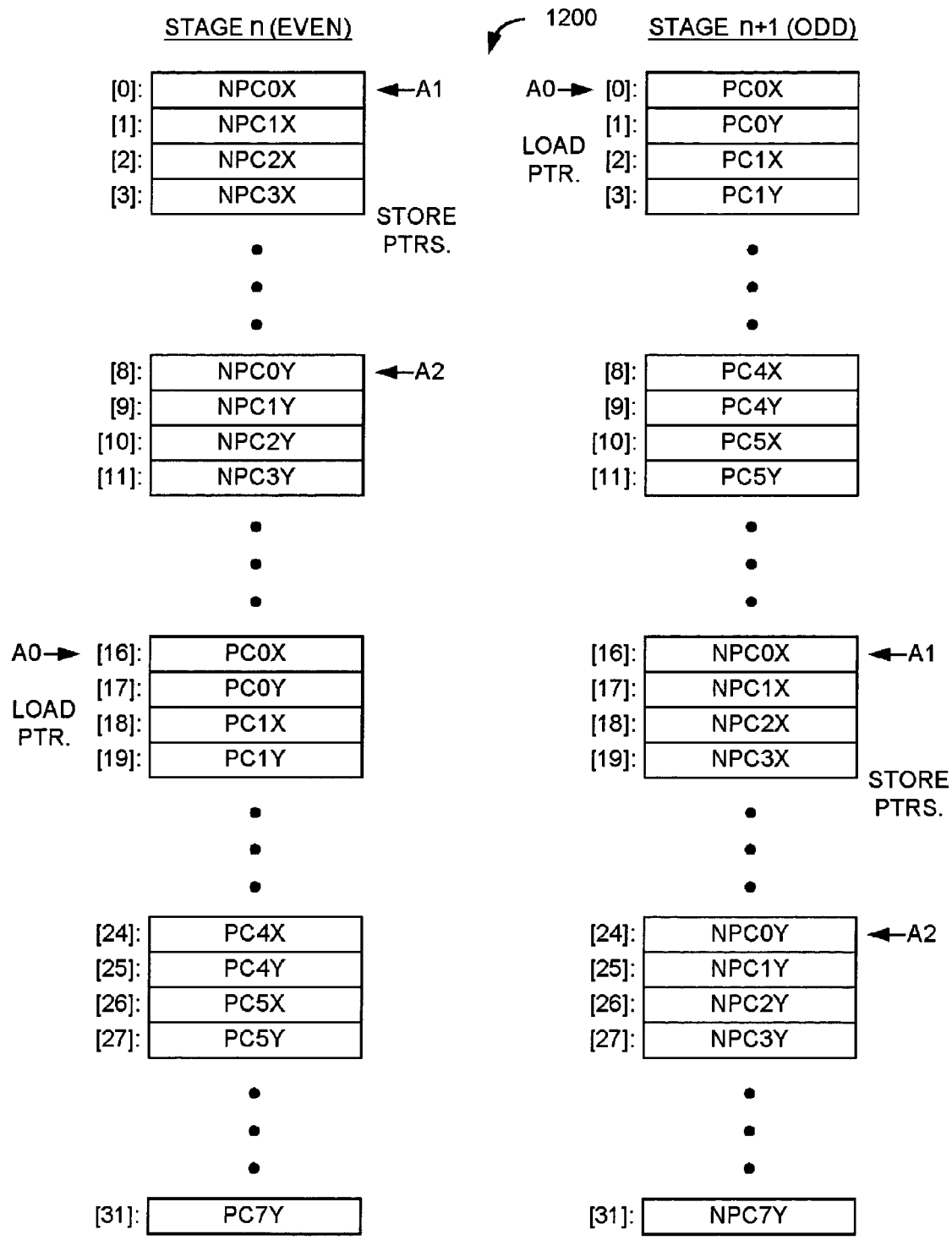
FIG. 12 is a diagram of the contents of a 32-element data structure in decoding stages n and (n+1) of a Viterbi decoder.

FIG. 12 is a diagram of the contents of the 32-element data structure 1200 in decoding stages n and (n+1) of the Viterbi decoder. As indicated in FIG. 12, a new path cost (NPC) stored in the data structure 1200 in stage n becomes the old path cost (PC) in stage (n+1). A single pointer (address register a0) is used to sequentially load up to 4 old path costs (PC) as input to the Viterbi instructions (i.e., the add-compare-select or ACS instructions 308 of FIGS. 3, 6A, and/or 7A). The destination registers of the Viterbi instructions are selected such that path cost reordering is not needed prior to storing. Two pointers (address registers a1 and a2) store data at the NPC(m) and NPC(m+M/2) locations. Data is stored to allow sequential access at the next stage.

As described above, in one embodiment of the processor 302 of FIG. 3, the load/store unit 404 includes 2 independent address generation units (AGUs). Each AGU may support, for example, one 16-, 32-, 40-, or 64-bit transfer per cycle of the CLOCK signal. The contents of 4 consecutive 16-bit general purpose registers of the register files 408 of FIG. 4 can be read or written during a single quad-word (64-bit) load/store operation. A set of "quad registers" available for 64-bit load/store operations is denoted "rNq" where N={0, 4,8,12}. That is, each quad register rNq includes 4 consecutive 16-bit general purpose registers of the register files 408 of FIG. 4. For example, quad register r0q includes general purpose registers r0, r1, r2, and r3. A 64-bit load operation to quad register r0q writes data from the memory system 304 of FIG. 3 (e.g., from the data structure 1200 of FIG. 12) to the general purpose registers r0, r1, r2, and r3 simultaneously. Data for the Viterbi decoder implemented using the ZSP500 DSP is grouped in quad registers to allow optimal use of quad-word load/store operations.

The Viterbi decoder implemented using the ZSP500 DSP carries out a symbol loop routine followed by a traceback routine. During the symbol loop routine, a cost metric is used at each stage of the trellis diagram to compute branch costs for each transition or branch. At each state, a branch cost associated with each of two incoming paths are computed and used to select a "survivor" path; the non-surviving path is abandoned. The branch cost associated with a particular transition represents the probability of the transition being correct. The path costs associated with the surviving paths are maintained as path metrics, each being a stage-by-stage, cumulative sum of the individual branch casts along the corresponding path. Each path metric represents a probability that the sequence of transitions along the path is correct.

At each stage, path metrics for each new state are calculated using each incoming branch cost plus the previous path cost associated with that branch. The minimum of the two incoming paths is selected as the survivor. The computations include two "add-compare-select" (ACS) operations and updating a history of the surviving path.

During the traceback routine, a path from end state '0' having the greatest probability of being correct (i.e., having the highest or lowest path metric) is traced back from node to node through the history of the surviving paths in reverse order. At each stage the surviving path having the greatest probability of being correct (i.e., having the lowest path metric) is selected. During the traceback routine, the original input data bit sequence is obtained in reverse order.

Symbol Loop Routine

Table 1 below lists the general purpose register (GPR) allocations for the symbol loop routine of the Viterbi decoder implemented by the ZSP500 DSP:

TABLE 1

General Purpose Register (GPR) Allocations For Symbol Loop Routine.

| GPR | Used to Store |
|---|---|
| r0 | NPCmx -- result of Viterbi instruction |
| r1 | NPCmy -- result of Viterbi instruction |
| r2 | NPC(m+1)x -- result of Viterbi instruction |
| r3 | NPC(m+1)y -- result of Viterbi instruction |
| r4 | PCmx |
| r5 | PCmy |
| r6 | PC(m+1)x |
| r7 | PC(m+1)y |
| r8 | Constant 8 (for address calculation) |
| r12 | $BC_{11} = -RxX - RxY$ |
| r13 | $BC_{00} = +RxX + RxY$ |
| r14 | $BC_{10} = -RxY + RxY$ |
| r15 | $BC_{01} = +RxX - RxY$ |

In table 1 above, 'm' represents a current state, 'x' represents an incoming branch from a lowest-valued state in a previous stage, and 'y' represents an incoming branch from a highest-valued state in the previous stage.

The general purpose registers r0 r1, r2, and r3 of the quad register rq0 are used to store the new path costs (NPC) results of the Viterbi instructions (i.e., the add-compare-select or ACS instructions 308 of FIGS. 3, 6A, and/or 7A).

The NPC0 and NPC1 results are stored using double word stores, and in seperate memory blocks to allow use of quad-word loads when they are recovered as previous path costs. (See the register r4–r7 allocations below).

Referring to FIG. 12, NPC0x, NPC1x, NPC0y, and NPC1y are new path costs in stage n that become old path costs PC0x, PC0y, PC4x, and PC4y, respectively, in stage (n+1). The path costs are stored in two discontinuous locations of the data structure 1200 of FIG. 12, but are reloaded sequentially.

Each new path cost (NPC) is calculated using the branch costs associated with the branches leading to the current node and the path cost associated with the node where those branches originated. The branch cost are stored in general purpose registers r12–r15 at the beginning of a symbol loop routine, and remain the same until the next symbol loop iteration. For each block of four nodes, the corresponding previous path costs are loaded into general purpose registers r4–r7.

For example, in calculations for stage (n+1) of FIG. 12, branch costs $BC_{11}$, $BC_{00}$, $BC_{10}$, and $BC_{01}$ are loaded into general purpose registers r12, r13, r14, and r15, respectively, and path costs PC0x, PC0y, PC1x, PC1y are loaded into registers r4, r5, r6, and r7, respectively. The new path costs NPC0x, NPC1x, NPC0y, and NPC1y may be generated and stored in general purpose registers r0, r1, r2, and r3, respectively, via the Viterbi instructions:

vit_a r0, r4, r12   // $r0 = \min\{(r4+r12), (r5+r13)\}$
                    // $r0 = \min\{(PC0x+BC_{11}), (PC0y+BC_{00})\}$
vit_b r1, r6, r12   // $r1 = \min\{(r6+r13), (r7+r12)\}$
                    // $r1 = \min\{(PC1x+BC_{00}), (PC1y+BC_{11})\}$
vit_b r2, r4, r12   // $r2 = \min\{(r4+r13), (r5+r12)\}$
                    // $r2 = \min\{(PC0x+BC_{00}), (PC0y+BC_{11})\}$
vit_a r3, r6, r12   // $r3 = \min\{(r6+r12), (r7+r13)\}$
                    // $r3 = \min\{(PC1x+BC_{11}), (PC1y+BC_{00})\}$ where the Viterbi instructions 'vit_a' are embodiments of the add-compare-select or ACS instructions 308 of FIGS. 3 and 6A–6C, and the Viterbi instructions 'vit_b' are embodiments of the add-compare-select or ACS instructions 308 of FIGS. 3 and 7A–7C.

The path costs PC2x, PC2y, PC3x, and PC3y are then loaded into registers r4, r5, r6, and r7, respectively. The new path costs NPC2x, NPC3x, NPC2y, and NPC2y may be generated and stored in general purpose registers r0, r1, r2, and r3, respectively, via the Viterbi instructions:

vit_a r0, r4, r12   // $r0 = \min\{(r4+r12), (r5+r13)\}$
                    // $r0 = \min\{(PC2x+BC_{11}), (PC2y+BC_{00})\}$
vit_b r1, r6, r12   // $r1 = \min\{(r6+r13), (r7+r12)\}$
                    // $r1 = \min\{(PC3x+BC_{00}), (PC3y+BC_{11})\}$
vit_b r2, r4, r12   // $r2 = \min\{(r4+r13), (r5+r12)\}$
                    // $r2 = \min\{(PC2x+BC_{00}), (PC2y+BC_{11})\}$
vit_a r3, r6, r12   // $r3 = \min\{(r6+r12), (r7+r13)\}$
                    // $r3 = \min\{(PC3x+BC_{11}), (PC3y+BC_{00})\}$ As indicated in Table 1 and described above, the general purpose registers r12, r13, r14, and r15 of the quad register r12q are used to store the branch costs $BC_{11} = -RxX - RxY$, $BC_{00}=+RxX+RxY$, $BC_{10}=-RxY+RxY$, and $BC_{01}=+RxX-RxY$, respectively. As described above, the branch costs $BC_{00}$, $BC_{01}$, $BC_{10}$, and $BC_{11}$ are associated with the 00, 01, 10, and 11 input symbols to the Viterbi decoder, respectively. New branch costs are calculated during each iteration of the symbol loop routine.

The general purpose registers r4, r5, r6, and r7 of the quad register r4q are used to store the previous path costs for four nodes of a current stage of a trellis diagram. Path costs and path cost calculations are described above. The path costs (PC) are loaded from the data structure 1200 of FIG. 12 using quad-word load operations (e.g., 'ldqxu' instructions).

The general purpose registers r8 of the quad register r8q is used to store the constant value 8 for address calculations. The general purpose registers r9, r10, and r11 of the quad register r8q are used to store intermediate results (i.e., used as scratch registers).

Table 2 below lists the address register (AR) allocations for the symbol loop routine of the Viterbi decoder implemented using the ZSP500 DSP:

TABLE 2

Address Register (AR) Allocations
For Symbol Loop Routine.

| AR | Used to Store |
|---|---|
| a0 | *PATHCOST |
| a1 | *NPC1x |
| a2 | *(NPC1x+8) = *NPC1y |
| a4 | *TRCBAK |
| a5 | *RXDATA |

In addition, an index register n0 is used to store the constant value 4.

The ZSP500 DSP completes the calculations of the symbol loop routine associated with each stage of the trellis diagram in 12 cycles of the CLOCK signal. The following variables are initialized prior to the start of a first iteration of the symbol loop:
r12=RxX,
r13=$BC_{00}$,
r14=RxY,
r4=PC0x; and
r5=PC0y The following is program code for the symbol loop routine written in assembly language for the ZSP500 digital signal processor (DSP):

```
SymbLoop: // Cycle_1:
    // Load previous path costs (PC1x, PC1y) for use in cycle 3.
    // Calculate BC10 & BC11; Update a2 store pointer
        lddu   r6,a0,2     // r6 = PC1x, r7 = PC1y
        sub    r14,r12     // r14 = BC10
        neg    r12,r13     // r12 = BC11
        add    a2, r8      // a2 = (NPC0x+8) = NPC0y
Cycle_2:
    // Calculate survivor path metrics for NPC0x & NPC0y.
    // r0 = NPC0x = min ((r4+r12), (r5+r13))
    // r2 = NPC0y = min ((r4+r13), (r5+r12))
        vit_a  r0,r4,r12
        vit_b  r2,r4,r12
Cycle_3:
    // Path costs in r6/r7; Branch costs in r12/r13; r15 = BC01.
    //Calculate survivor path metrics for NPC1x.
        neg    r15,r14     // r15=BC01
        vit_b  r1,r6,r12
Cycle_4:
    // Calculate survivor path metrics for NPC1y.
    vit_a  r3, r6, r12
    ldqxu  r4,a0          // r4=PC2x, r5=PC2y, r6=PC3x, r7=PC3y
    stdu   r0,a1,2        // Store NPC0x, NPC1x
Cycle_5:
    // Calculate survivor path metrics for NPC2x & NPC2y.
    stdu   r2,a2,2        // Store NPC0y, NPC1y
    vit_a  r0,r4, r12
    vit_b  r2, r4, r12
Cycle_6:
    // Calculate survivor path metrics for NPC3x & NPC3y.
    vit_b  r1,r6,r12
    vit_a  r3,r6, r12
    ldqxu  r4,a0          // r4=PC4x, r5=PC4y, r6=PC5x, r7=PC5y
    stdu   r0,a1,2        // Store NPC2x, NPC3x
Cycle_7:
    // Calculate survivor path metrics for NPC4x & NPC4y
    stdu   r2,a2,2        // Store NPC2y, NPC3y
    vit_a  r0, r4, r14
    vit_b  r2,r4,r14
Cycle_8:
    // Calculate survivor path metrics for NPC5x & NPC5y.
    vit_b  r1,r6,r14
    vit_a  r3,r6,r14
    ldqxu  r4,a0          // r4=PC6x, r5=PC6y, r6=PC7x, r7=PC7y
    stdu   r0,a1,2        // Store NPC4x, NPC5x
Cycle_9:
    //Calculate survivor path metrics for NPC6x & NCP6y.
    stdu   r2,a2,2        // Store NPC4y, NPC5y
    vit_a  r0,r4,r14
    vit_b  r2,r4,r14
Cycle_10:
    // Calculate survivor path metrics for NPC7x & NPC7y.
    lddu   r12,a5,2       // r12=RxX, r13=RxY (next symbol)
    lddu   r4,a0,2        // r4=PC0x, r5=PC0y (for next stage)
    vit_b  r1,r6,r14
    vit_a  r3,r6,r14
Cycle_11:
    stdu   r0,a1,2        // Store NPC6x, NPC7x
    stdu   r2,a2,2        // Store NPC6y, NPC7y
    mov    r14,r13        // r14=RxY
    add    r13,r12        // r13=RxX+RxY
Cycle_12:
    // a2 now points to NPC0x for next stage
    mov    a1,a2          // a1=NPC0x for next stage
    mov    r0,%vitr       // only 16 bits of 32-bit %vitr used
    stu    r0,a4,1        // Update Traceback Table
    agn1   SymbLoop
```

Traceback Routine

Table 3 below lists the general purpose register (GPR) allocations for the traceback routine of the Viterbi decoder implemented using the ZSP500 DSP:

TABLE 3

General Purpose Register (GPR) Allocations
For Traceback Routine.

| GPR | Used to Store |
|---|---|
| r0 | current state (rC) |
| r1 | current state (rC) |
| r2 | 2*rem(rC,8) + 1 (r2 LSB is set to 1) |
| r4 | traceback bit |
| r5 | control word far traceback bit extraction |
| r6 | r6=0 (if rC < 8) or 1 (if rC>7) |
| r13 | traceback information for current state |
| r14 | working register for accumulated output bits |

Table 4 below lists the address register (AR) allocations for the traceback routine of the Viterbi decoder implemented using the ZSP500 DSP:

TABLE 4

Address Register (AR) Allocations
For Traceback Routine.

| AR | Used to Store |
|---|---|
| a3 | *OUTPUT |
| a4 | *TRCBAK |

A 16-bit Viterbi traceback register value is generated during each iteration of the symbol loop routine. Each bit of the traceback register value corresponds to an ACS decision selecting the shortest path through the trellis diagram including the portion 200 of FIG. 2 for a particular stage and state. Each 16-bit word represents the results for all 16 states at a given stage of the trellis diagram. These results are stored sequentially in memory in 189 consecutive locations as a traceback array with one word for each original input bit.

The traceback routine uses this information in an attempt to recreate the original shift register states seen in the convolutional encoder 100 of FIG. 1, and therefore the input bits that generated those states. The traceback routine essentially works backwards through the traceback array starting with the last generated element from the symbol loop routine. The traceback routine follows the shortest path back to the beginning stage of the trellis diagram including the portion 200 of FIG. 2. At each step along the shortest path one of the 189 input data bits is recovered.

Referring back to FIG. 2, if state '0000' is the current state in stage n then the previous state in stage n−1 may be either state '0000' or '1000', depending on which path is shortest path. However, the only way to get to state '0000' is for the data input D(n) to the convolutional encoder 100 of FIG. 1 to be a logic '0' (as indicated by the solid lines in FIG. 2). By tracing back through the trellis diagram including the portion 200 of FIG. 2, all 189 input bits can be recovered.

The traceback routine actually consists of two nested loops to facilitate generating the output words 13 an inner bit loop and an outer word loop. The word loop is used to store bit-packed output words. Each iteration of the inner loop uses a new 16-bit traceback array element to generate a new output bit. References to the "traceback loop" below refer to the inner bit loop of the traceback routine.

Since GSM encoding includes tail bits to assure that the final state is 0 as described above, there is no need to calculate the shortest path length for all 16 possible starting states. The traceback loop starts at state 0 by virtue of the tail bits.

Register r13 contains the 16-bit traceback array element for the current iteration of the traceback loop. The elements of the traceback array are used in a FILO (first in, last out) order. This is the reverse of the order in which they were created during the symbol loop routine. The initial value of register r13 is the last Viterbi register value calculated by the symbol loop routine. For algorithm convenience, traceback array elements have their bits reordered by the "revb" instruction prior to first use. This bit reordering swaps bit 0 with bit 15; bit 1 with bit 14; bit 2 with bit 13; and so on.

Register r0 is a recreation of the shift register used in the convolutional encoder 100 of FIG. 1, and also represents the current state in a stage of the trellis diagram including the portion 200 of FIG. 2. Register r0 contains 4 memory elements, and starts with an initial value of 0. At each iteration of the traceback loop, a single bit is selected from the traceback word. This bit is then inverted and shifted into the shift register. The bit shifted out the other end is the output bit, and is contained in register r6.

Table 5 below lists register contents during an exemplary portion of the traceback routine:

TABLE 5

Register Contents
During an Exemplary Portion
of the Traceback Routine.

| r13 | r4 Sel. Bit | Inv. Bit | r0 Prev State | r0 Curr. State | r6 Prev. Output | r6 Curr. Output | r5[11:8] Bit Index |
|---|---|---|---|---|---|---|---|
| 1101 0011 1101 1111 | 1 | 0 | 0000 | 0000 | 0 | 0 | 0000 |
| 1111 0011 1011 1011 | 1 | 0 | 0000 | 0000 | 0 | 0 | 0000 |
| 0100 0110 0110 0110 | 0 | 1 | 0000 | 0001 | 0 | 0 | 0000 |
| 0110 0110 0110 1111 | 1 | 0 | 0001 | 0010 | 0 | 0 | 0010 |
| 0110 0111 1011 1001 | 1 | 0 | 0010 | 0100 | 0 | 0 | 0100 |
| 1001 1011 1111 1011 | 1 | 0 | 0100 | 1000 | 0 | 1 | 1000 |
| 0000 0011 0001 0000 | 0 | 1 | 1000 | 0001 | 1 | 0 | 0001 |
| 1111 0000 0110 1110 | 1 | 0 | 0001 | 0010 | 0 | 0 | 0010 |
| 0110 0111 1011 1001 | 1 | 0 | 0010 | 0100 | 0 | 0 | 0100 |
| 0000 0000 0000 0100 | 0 | 1 | 0100 | 1001 | 0 | 1 | 1000 |
| 1101 1101 1101 1101 | 1 | 0 | 1001 | 0010 | 1 | 0 | 0011 |
| 0010 0110 0110 0110 | 0 | 1 | 0010 | 0101 | 0 | 0 | 0100 |
| 0110 0110 0000 0000 | 1 | 0 | 0101 | 1010 | 0 | 1 | 1010 |
| 0110 1100 0110 0110 | 1 | 0 | 1010 | 0100 | 1 | 0 | 0101 |
| 0110 0100 0110 0100 | 0 | 1 | 0100 | 1001 | 0 | 1 | 1000 |
| 1111 1011 1001 1101 | 1 | 0 | 1001 | 0010 | 1 | 0 | 0011 |
| 0110 0111 0110 0111 | 0 | 1 | 0010 | 0101 | 0 | 0 | 0100 |
| 1001 0001 0010 0010 | 0 | 1 | 0101 | 1011 | 0 | 1 | 1010 |
| 0000 1011 0010 0100 | 0 | 1 | 1011 | 0111 | 1 | 0 | 0111 |
| 1111 0100 0110 0110 | 1 | 0 | 0111 | 1110 | 0 | 1 | 1110 |

Each row in Table 5 above represents an iteration of the traceback loop. The register r13 contains the reverse of the Viterbi register. The "selected bit" is selected from the register r13 bits using the register r5[11:8] "bit index."

The notation "r5[11:8]" refers to bits 11 through 8 of register r5. The register r5[11:8] bit index is formed by left shifting the previous state by one bit position and logically ANDing the result with the previous output. The r5[11:8] bit index is a binary representation of the relevant bit position to select from register r13. The register r0 current state is formed by left shifting the inverted bit "Inv. Bit" into the previous state. The register r6 current output is the bit shifted out of the current state on the transition to the next state.

The following is program code for the traceback routine written in assembly language for the ZSP500 digital signal processor. A traceback table is generated during the symbol loop routine as described above by storing 16 bits of the Viterbi register 'vitr' after each stage. The 16 bits of the Viterbi register are the history of survivor paths selected for each ACS function, and hence the history of encoder input bits that generated those paths. A "0" means the first path of the vit_x comparison was selected as minimum, and a "1" means the second path of the vit_x comparison was selected.

As described above, the traceback algorithm follows the trellis diagram including the portion 200 of FIG. 2 backwards through all 189 Viterbi register entries. It determines the current output bit for a stage by using the current state as an index into the Viterbi register bits. Output bits are recovered in the reverse order from their transmission.

```
TBLoops: // Cycle_TB_1:
// Begin building a control word (r5) to extract the traceback bit
    shll   r15,1        // r15 << 1 and r15[LSB]=0
    ins    r5,r0        // r5 = 0x0#01 Control: <r1 = 0x903>
    shrl   r6,3         // r6=0 (if rC < 8) or 1 (if rC > 7)
    ldu    r13,a4,-1    // r13 (rT) = Traceback info (vitr)
Cycle_TB_2:
// Complete building the r5 control word
// Reverse the traceback info
    ins    r5,r6,8,1    // r5 = 0x0#01
    revb   r13,15       // reverse Traceback info sequence
Cycle_TB_3:
// Using control in r5, extract the traceback bit from r13 to r4
// r4 now has current traceback bit
    ins    r2,r0,1,3    // r2 = 2*rem(rC,8) + 1 (r2 LSB is set to 1)
    ext    r4,r13       // r4[LSB] = "traceback bit" (r4 = 0 or 1)
Cycle_TB_4:
// Update output word with current output bit
    or     r15,r6       // r15[LSB]=current output bit
    sub    r0,r2,r4     // r0 = rC (updated)
    sub    r6,r2,r4     // r6 = rC (to extract bit rC[3])
    agn0   TBLoops
Cycle_TB_5:
// Store packed output; reload loop counter; repeat loop
    stu    r15,a3,-1    // Store O/P (packed word)
    mov    r15,0        // Clear O/P word
    mov    %loop0,15    // 16 bits per O/P word
    agn1   TBLoops
```

The ZSP500 DSP has enhanced support for bit manipulation, including a bit insert instruction "INS" and a bit extract instruction "EXT." The traceback processing makes effective use of these bit-level operations.

In the ZSP500 DSP implementation, an average of 4 cycles per stage are used in the traceback routine. The outer loop is executed once per output word, for 12 iterations. The inner loop is executed once per bit in each output word 13 16 iterations for all but the first word, which uses 13 iterations. Total cycles for traceback is (16*4+1)*12−(3*4)=768 cycles.

Viterbi Benchmarks for Digital Signal Processors

Viterbi benchmark cycle counts for general purpose digital signal processors (DSPs) are shown in Table 6. Processor cycles for Viterbi decoding, traceback and overhead are all combined into "Cycles per Decoded Output Bit." Sources for external information are documented in the references.

TABLE 6

Viterbi Benchmarks for DSPs-
Rate = ½, Constraint Length = 5, Frame Size = 189 Bits.

| Processor | Cycles per Decoded Output Bit |
|---|---|
| Texas Instruments 'C54 | 61 |
| ADSP-2106x SHARC | 58 |
| Texas Instruments 'C62 | 38 |
| 3D5P SP-5 | 33 |
| Infineon Cannel | 22 |
| LSI Logic ZSP500 | 16 |
| Texas Instruments 'C64 | 14 |
| StarCore SC140 | 11 |

References for information in Table 6 are available from the authors on request.

At 16 cycles per decoded output bit, the above described implementation of the Viterbi decoder for GSM speech channel decoding using the ZSP500 DSP outperforms many mainstream dual-MAC DSPs and approaches performance seen in high performance quad-MAC DSPs with more functional units. With 189 bits per frame at 50 frames per second, the ZSP500 processing load was 0.16 MHz. Depending on additional application tasks that need to be handled, multiple voice channels can be assigned to the ZSP500. This is also for true for recent third generation (3G) wireless systems where convolutional encoders with longer constraint lengths (K=9) are used. The ZSP500 processing load for Viterbi decoding of each WCDMA speech channel is estimated to be 2.4 MHz.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What we claim as our invention is:

1. A processor for convolutional decoding, said processor embodying a pipelined superscalar processor core, comprising:

an instruction prefetch unit, the instruction prefetch unit configured to simultaneously fetch first and second Viterbi instructions and to partially decode and align the first and second Viterbi instructions;

an instruction sequencing unit, the instruction sequencing unit configured to fully decode the partially decoded first and second Viterbi instructions and to group the fully decoded first and second Viterbi instructions for simultaneous execution;

a first processing unit for executing a first Viterbi instruction, the instruction sequencing unit issuing the first Viterbi instruction to the first processing unit;

a second processing unit for executing a second Viterbi instruction, the instruction sequencing unit issuing the second Viterbi instruction to the second processing unit;

a register comprising a plurality of ordered bit positions; and update logic coupled to the register, the first processing unit and the second processing unit, the update logic configured to receive a first signal indicative of a result of a first add-compare-select instruction from the first processing unit and a second signal indicative of a result of a second add-compare-select instruction from the second processing unit, the update logic further configured to update the contents of the register dependent upon the first and second signals;

wherein, in the event that: (1) the first signal but not the second signal, or (2) the second signal but not the first signal, is received, the update logic is configured to shift the contents of the register such that one bit position is vacated and to update the vacated bit position dependent on the received signal; and wherein in the event the first and second signals are received substantially simultaneously, the update logic is configured to shift the contents of the register 2 bit positions in order thereby vacating 2 consecutive bit positions, to update one of the vacated bit positions dependent upon the first signal, and to update the other vacated bit position dependent upon the second signal.

2. The processor as recited in claim 1, wherein the first add-compare-select instruction and the second add-compare-select instruction each specify two add operations, a compare operation, and a select operation.

3. The processor as recited in claim 2, wherein the first add-compare-select instruction and the second add-compare-select instruction each specify a first pair of source operands and a second pair of source operands, and wherein each of the add operations specifies summing one of the first pair of source operands and one of the second pair of source operands.

4. The processor as recited in claim 2, wherein the compare operation comprises comparing results of the two add operations.

5. The processor as recited in claim 2, wherein the select operation comprises producing a result dependent upon a result of the compare operation.

6. The processor as recited in claim 2, wherein the processor is configured such that the first processing unit executes the first add-compare-select instruction and the second processing unit simultaneously executes the second add-compare-select instruction based upon a set of instruction grouping rules.

7. The processor as recited in claim 1 and further comprising an execution unit, the first and second processing units residing within the execution unit.

8. The processor as recited in claim 1, wherein the instruction prefetch unit further comprises an instruction cache in which the partially decoded and aligned instructions are stored.

9. A processor for decoding convolutional code, said processor embodying a pipelined superscalar processor core, comprising:

an instruction prefetch unit, said instruction prefetch unit configured to fetch at least two Viterbi instructions at a time and partially decode and align the at least two fetched Viterbi instructions:

an instruction sequencing unit, said instruction sequencing unit configured to group two of said at least two fetched Viterbi instructions for simultaneous execution;

an arithmetic logic unit (ALU);

a multiply/accumulate unit (MAU);

said instruction sequencing unit issuing a first one of the two Viterbi instructions to the ALU for execution thereby;

the instruction sequencing unit issuing a second one of the two Viterbi instructions to the MAU for execution thereby;

the ALU executing a first add-compare-select (ACS) operation on the first Viterbi instruction generally simultaneous with the MAU executing a second ACS operation on the second Viterbi instruction;

a register comprising a plurality of ordered bit positions; and update logic coupled to the register, the ALU and the MAU, the update logic configured to receive the first signal issued by the ALU and the second signal issued by the MAU, the update logic updating the contents of the register based upon the first signal issued by the ALU and the second signal issued by the MAU;

wherein in the event that the first signal issued by the ALU and the second signal issued by the MAU are received substantially simultaneously, the update logic shifting the contents of the registry 2 bit positions in order to vacate 2 consecutive bit positions of the register, the update logic updating one of the vacated bit positions based upon the first signal issued by the ALU and updating the other vacated bit position based upon the second signal issued by the MAU.

10. The processor as recited in claim 9, wherein each of the two add-compare-select instructions specifies two add operations, a compare operation, and a select operation.

11. The processor as recited in claim 10, wherein each of the two add-compare-select instructions specifies a first pair of source operands and a second pair of source operands, and wherein each of the two add operations specifies summing one of the first pair of source operands and one of the second pair of source operands.

12. The processor as recited in claim 10, wherein the compare operation comprises comparing results of the two add operations.

13. The processor as recited in claim 10, wherein the select operation comprises producing a result dependent upon a result of the compare operation.

14. The processor as recited in claim 9, wherein the two add-compare-select instructions are dispatched to the ALU and the MAU for simultaneous execution dependent upon a set of instruction grouping rules.

15. The processor as recited in claim 9, and further comprising an execution unit, the ALU and the MAU residing within the execution unit.

16. The processor as recited in claim 9, wherein the instruction prefetch unit further comprises an instruction cache in which the partially decoded and aligned instructions arc stored.

* * * * *